United States Patent
Nah et al.

(10) Patent No.: US 10,937,735 B2
(45) Date of Patent: Mar. 2, 2021

(54) HYBRID UNDER-BUMP METALLIZATION COMPONENT

(71) Applicant: International Business Machines Corporation, Armonk, NY (US)

(72) Inventors: Jae-Woong Nah, Closter, NJ (US); Eric Peter Lewandowski, White Plains, NY (US); Adinath Shantinath Narasgond, Yonkers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 48 days.

(21) Appl. No.: 16/136,808

(22) Filed: Sep. 20, 2018

(65) Prior Publication Data

US 2020/0098695 A1    Mar. 26, 2020

(51) Int. Cl.
*H01L 23/532* (2006.01)
*H01L 23/00* (2006.01)
*H01L 21/768* (2006.01)
*G06N 10/00* (2019.01)

(52) U.S. Cl.
CPC .. *H01L 23/53285* (2013.01); *H01L 21/76891* (2013.01); *H01L 24/03* (2013.01); *H01L 24/07* (2013.01); *H01L 24/10* (2013.01); *H01L 24/11* (2013.01); *H01L 24/12* (2013.01);
(Continued)

(58) Field of Classification Search
CPC ............. H01L 29/437; H01L 21/28026; H01L 23/49888; H01L 23/53285; H01L 24/10; H01L 24/12; H01L 39/2409; H01L 39/04; H01L 39/2474; H01L 24/11; H01L 24/13;
(Continued)

(56) References Cited

U.S. PATENT DOCUMENTS

| | | | |
|---|---|---|---|
| 6,287,950 B1 * | 9/2001 | Wu | H01L 24/03 257/E21.508 |
| 8,159,825 B1 | 4/2012 | Dotsenko | |
| 8,820,612 B2 | 9/2014 | Feger et al. | |

(Continued)

FOREIGN PATENT DOCUMENTS

| | | |
|---|---|---|
| JP | 58207685 A | 12/1983 |
| JP | 5820768 A | 8/1992 |
| JP | H08202244 A | 8/1996 |

OTHER PUBLICATIONS

International Search Report and Written Opinion for International Application Serial No. PCT/EP2019/075078 dated Dec. 17, 2019, 17 pages.

(Continued)

*Primary Examiner* — David A Zarneke
(74) *Attorney, Agent, or Firm* — Amin, Turocy & Watson, LLP

(57) ABSTRACT

Devices and methods that can facilitate hybrid under-bump metallization components are provided. According to an embodiment, a device can comprise an under-bump metallization component that can comprise a superconducting interconnect component and a solder wetting component. The device can further comprise a solder bump that can be coupled to the superconducting interconnect component and the solder wetting component. In some embodiments, the superconducting interconnect component can comprise a hermetically sealed superconducting interconnect component.

10 Claims, 11 Drawing Sheets

(52) U.S. Cl.
CPC .............. *H01L 24/13* (2013.01); *H01L 24/15* (2013.01); *H01L 24/16* (2013.01); *G06N 10/00* (2019.01)

(58) Field of Classification Search
CPC ......... H01L 24/15; H01L 24/03; H01L 24/07; H01L 21/76891; H01L 29/45
See application file for complete search history.

(56) References Cited

U.S. PATENT DOCUMENTS

| | | | | |
|---|---|---|---|---|
| 9,865,648 | B2* | 1/2018 | Bunyk | .................... H01L 27/18 |
| 2004/0061229 | A1 | 4/2004 | Moslehi | |
| 2006/0055032 | A1* | 3/2006 | Chang | ................. H01L 21/4853 |
| | | | | 257/734 |
| 2006/0237865 | A1* | 10/2006 | Morrison | ................. B01J 13/04 |
| | | | | 264/4.1 |
| 2007/0069394 | A1* | 3/2007 | Bachman | ................ H01L 24/03 |
| | | | | 257/780 |
| 2010/0163292 | A1 | 7/2010 | Tsai et al. | |
| 2012/0306104 | A1* | 12/2012 | Choi | ................. H01L 23/49811 |
| | | | | 257/782 |
| 2013/0001777 | A1* | 1/2013 | Veychard | ................ H01L 24/03 |
| | | | | 257/738 |
| 2014/0246763 | A1 | 9/2014 | Bunyk | |
| 2016/0126175 | A1* | 5/2016 | Hsu | ................... H01L 23/49827 |
| | | | | 174/255 |
| 2017/0133336 | A1 | 5/2017 | Oliver et al. | |
| 2017/0373658 | A1 | 12/2017 | Thom et al. | |
| 2019/0006312 | A1* | 1/2019 | Arvin | ...................... H01L 24/11 |
| 2019/0326228 | A1* | 10/2019 | Yu | ........................... H01L 24/49 |

OTHER PUBLICATIONS

Foxen, et al., Qubit compatible superconducting interconnects, Quantum Science Technology, Nov. 30, 2017, 12 Pages, vol. 3.
Nah, et al., Wafer IMS (Injection Molded Solder)—A New Fine Pitch Solder Bumping Technology on Wafers with Solder Alloy Composition Flexibility, 2014 Electronic Components & Technology Conference, 2014, pp. 1308-1313.

* cited by examiner

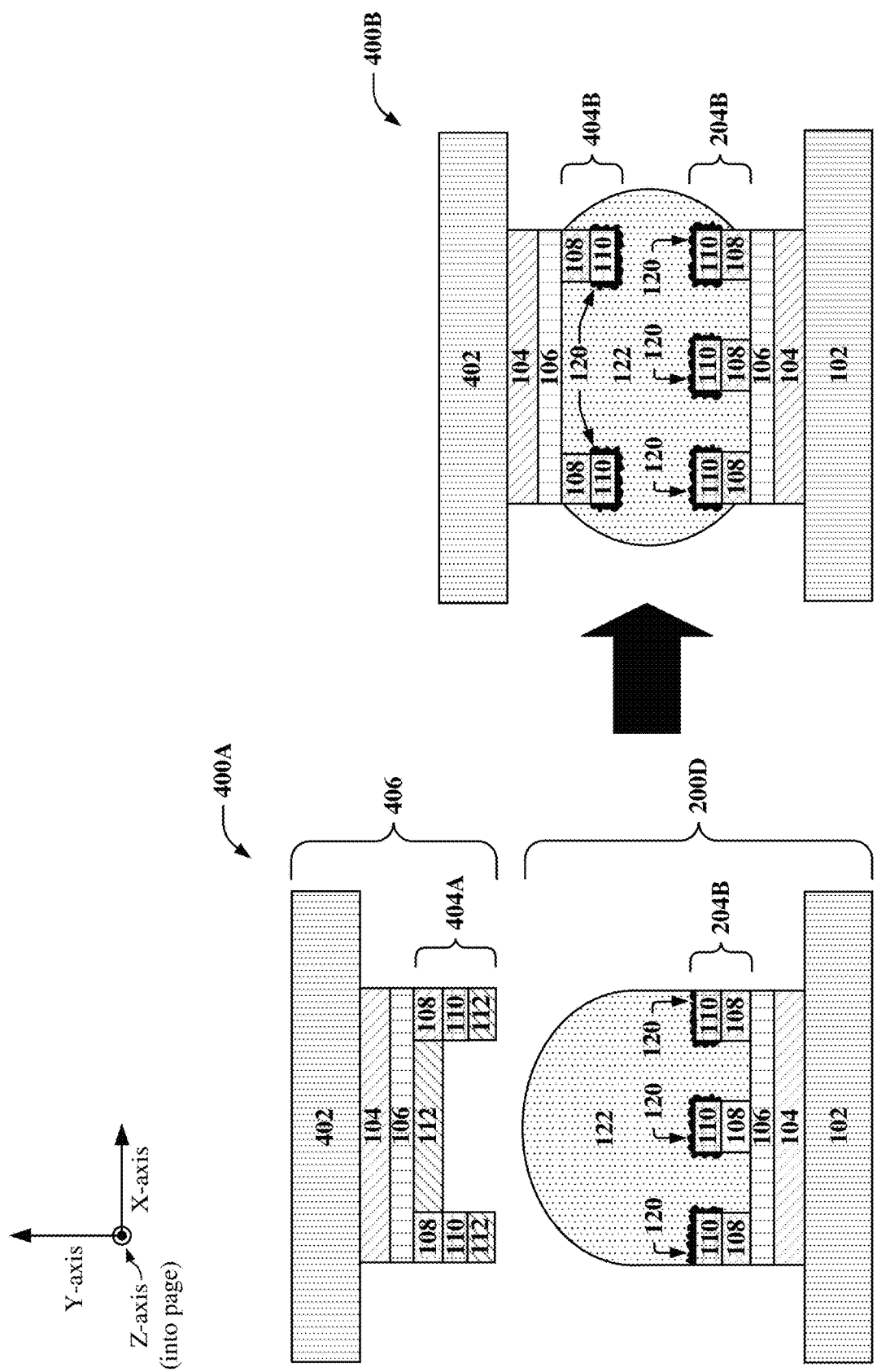

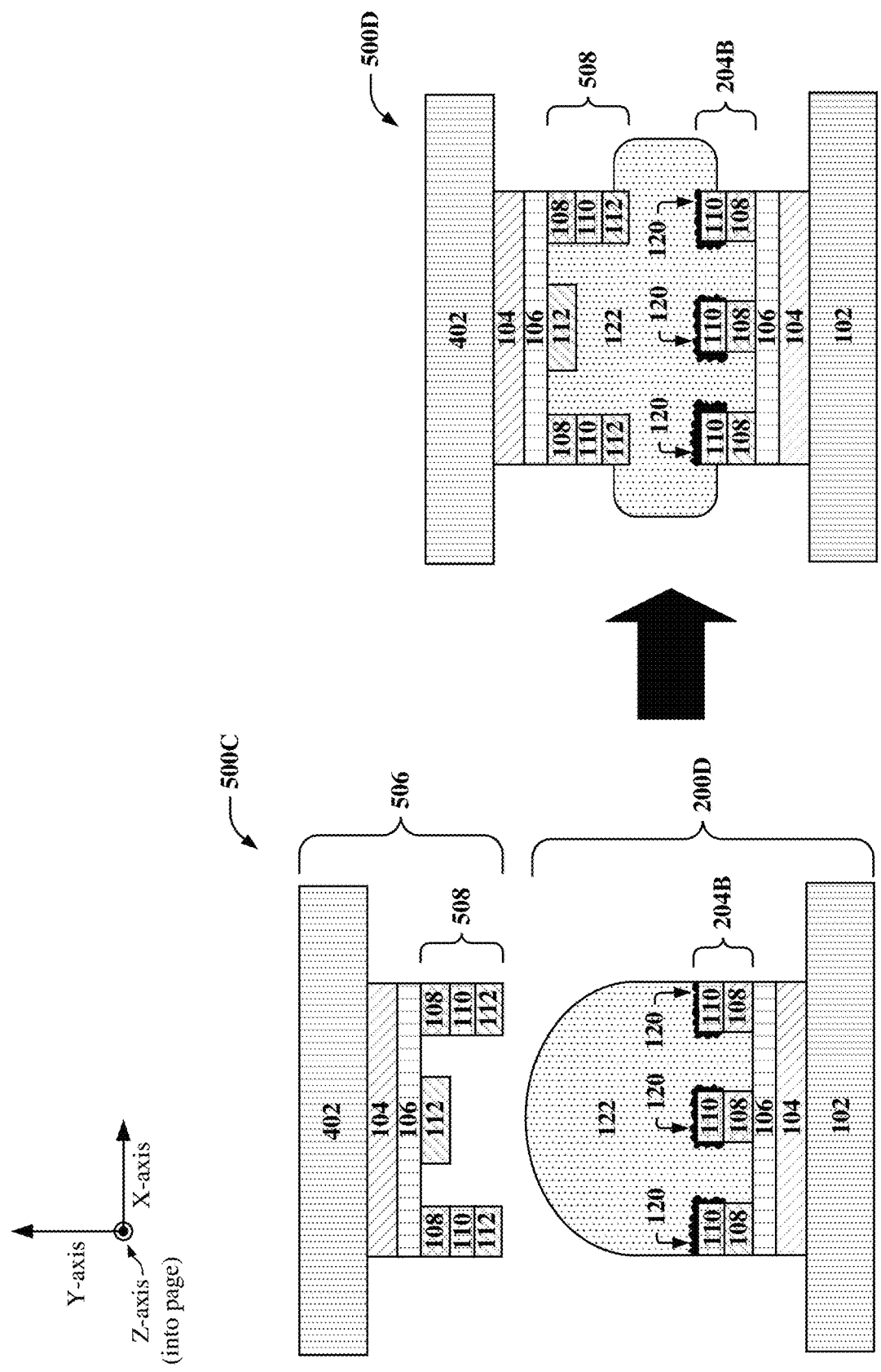

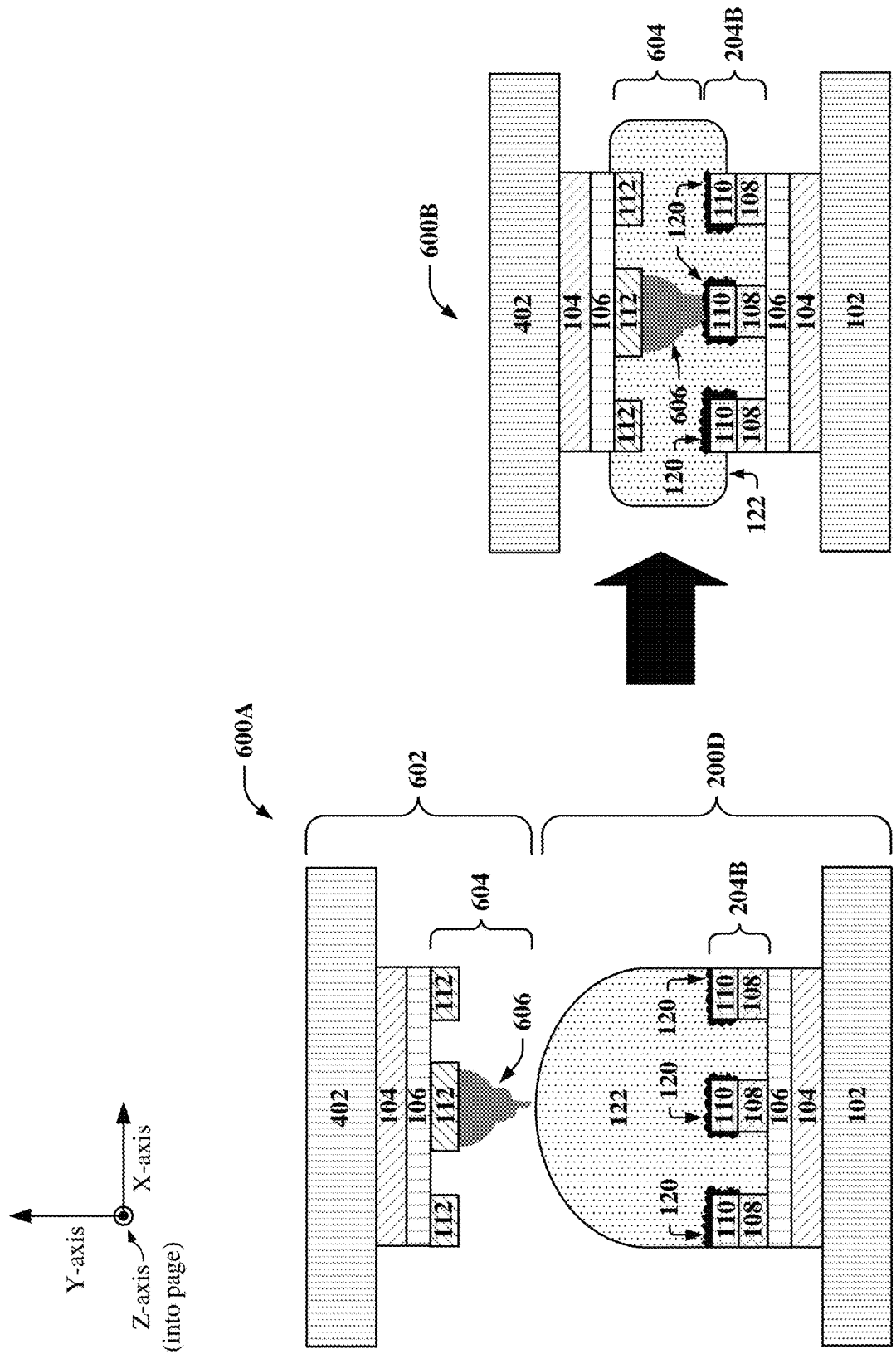

HYBRID UNDER-BUMP METALLIZATION COMPONENT

BACKGROUND

The subject disclosure relates to superconducting devices, and more specifically, to a superconducting and mechanically robust under-bump metallization component fabricated on semiconductor substrates.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Quantum computing hardware can be different from classical computing hardware. In particular, quantum computing hardware generally comprises superconducting quantum circuits, which can be fabricated in a semiconductor device and employed in a flip chip packaged quantum device that can be used in such quantum computing hardware. Such quantum computing hardware (e.g., a superconducting quantum processor) can execute computations and information processing functions that are substantially more complex than can be executed by classical computing devices (e.g., general-purpose computers, special-purpose computers, etc.).

Challenges associated with designing such a superconducting quantum circuit that can be implemented in a flip chip packaged quantum device include, but are not limited to: providing a superconducting interconnection and a mechanically robust interconnection between various components of such superconducting quantum circuit and/or flip chip packaged quantum device; and providing a hermetically sealed superconducting interconnection between various components of such circuit and/or device. Existing superconducting quantum circuits and/or flip chip packaged quantum devices attempt to overcome one or more of the challenges listed above; however, such prior art circuits and/or devices fail to do so, or they create design tradeoffs, manufacturing tradeoffs, and/or other problems such as, for example, lack of performance reliability and/or excessive power consumption.

For instance, some prior art superconducting quantum circuits and/or flip chip packaged quantum devices provide superconducting interconnection between various components of such circuits and/or devices. Problems with such prior art include, but are not limited to: they do not provide a hermetically sealed superconducting interconnection; and/or the mechanical coupling of various components of such a circuit and/or device is weak. In another example, some prior art circuits and/or devices provide strong mechanical coupling of various components of an integrated circuit and/or flip chip packaged device. Problems with such prior art include, but are not limited to: they do not provide superconducting interconnection between various components of such integrated circuit and/or flip chip packaged device; and/or they do not provide a hermetically sealed superconducting interconnection between such various components.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate hybrid under-bump metallization components are described.

According to an embodiment, a device can comprise an under-bump metallization component that can comprise a superconducting interconnect component and a solder wetting component. The device can further comprise a solder bump that can be coupled to the superconducting interconnect component and the solder wetting component. An advantage of such a device is that it can facilitate superconducting interconnection between, and robust mechanical coupling of, various components of a superconducting quantum circuit and/or flip chip packaged quantum device.

In another embodiment, the superconducting interconnect component can comprise a hermetically sealed superconducting interconnect component. An advantage of such a device is that it can eliminate oxide formation (e.g., oxidation) between various components of a superconducting quantum circuit and/or flip chip packaged quantum device that can be coupled by such hermetically sealed superconducting interconnect component, thereby facilitating improved electrical coupling between such components.

According to an embodiment, a method can comprise depositing solder on an under-bump metallization component. The method can further comprise forming a superconducting interconnect component and an intermetallic compound layer on the under-bump metallization component based on the depositing. An advantage of such a method is that it can be employed to fabricate a hybrid under-bump metallization component that can facilitate superconducting interconnection between, and robust mechanical coupling of, various components of a superconducting quantum circuit and/or flip chip packaged quantum device.

In another embodiment, the method can further comprise forming a hermetically sealed superconducting interconnect component on the under-bump metallization component based on the depositing. An advantage of such a method is that it can be employed to fabricate a hybrid under-bump metallization component that can eliminate oxide formation (e.g., oxidation) between various components of a superconducting quantum circuit and/or flip chip packaged quantum device that can be coupled by such hermetically sealed superconducting interconnect component, thereby facilitating improved electrical coupling between such components.

According to an embodiment, a device can comprise a substrate that can have a superconducting layer and an intermetallic compound layer. The device can further comprise a solder bump that can be coupled to the superconducting layer and the intermetallic compound layer. An advantage of such a device is that it can facilitate superconducting interconnection between, and robust mechanical coupling of, various components of a superconducting quantum circuit and/or flip chip packaged quantum device.

In another embodiment, the superconducting layer can be hermetically sealed by at least one of the intermetallic compound layer or the solder bump. An advantage of such a device is that it can eliminate oxide formation (e.g., oxidation) between various components of a superconducting quantum circuit and/or flip chip packaged quantum device that can be coupled by such hermetically sealed superconducting layer, thereby facilitating improved electrical coupling between such components.

According to an embodiment, a device can comprise a first under-bump metallization component that can comprise a superconducting interconnect component and an intermetallic compound layer. The device can further comprise a solder bump that can be coupled to the superconducting interconnect component, the intermetallic compound layer, and a second under-bump metallization component. An advantage of such a device is that it can facilitate superconducting interconnection between, and robust mechanical coupling of, various components of a superconducting quantum circuit and/or flip chip packaged quantum device.

In another embodiment, the superconducting interconnect component can comprise a hermetically sealed superconducting interconnect component. An advantage of such a device is that it can eliminate oxide formation (e.g., oxidation) between various components of a superconducting quantum circuit and/or flip chip packaged quantum device that can be coupled by such hermetically sealed superconducting interconnect component, thereby facilitating improved electrical coupling between such components.

According to an embodiment, a method can comprise coupling a first under-bump metallization component to a second under-bump metallization component comprising a superconducting interconnect component and an intermetallic compound layer. The method can further comprise forming a hermetically sealed superconducting interconnect component on the first under-bump metallization component based on the coupling. An advantage of such a method is that it can be employed to fabricate a flip chip device that can facilitate superconducting interconnection between, and robust mechanical coupling of, various components of such flip chip device. Another advantage of such a method is that it can be employed to fabricate a flip chip device that can eliminate oxide formation (e.g., oxidation) between various components of such a flip chip device that can be coupled by such hermetically sealed superconducting interconnect component, thereby facilitating improved electrical coupling between such components.

DESCRIPTION OF THE DRAWINGS

FIG. 4A illustrates a cross-sectional side view of an example, non-limiting device that facilitates hybrid under-bump metallization components in accordance with one or more embodiments described herein.

FIG. 4B illustrates a cross-sectional side view of an example, non-limiting device that facilitates hybrid under-bump metallization components in accordance with one or more embodiments described herein.

FIG. 5C illustrates a cross-sectional side view of an example, non-limiting device that facilitates hybrid under-bump metallization components in accordance with one or more embodiments described herein.

FIG. 5D illustrates a cross-sectional side view of an example, non-limiting device that facilitates hybrid under-bump metallization components in accordance with one or more embodiments described herein.

FIG. 6A illustrates a cross-sectional side view of an example, non-limiting device that facilitates hybrid under-bump metallization components in accordance with one or more embodiments described herein.

FIG. 6B illustrates a cross-sectional side view of an example, non-limiting device that facilitates hybrid under-bump metallization components in accordance with one or more embodiments described herein.

DETAILED DESCRIPTION

Figure 1B:
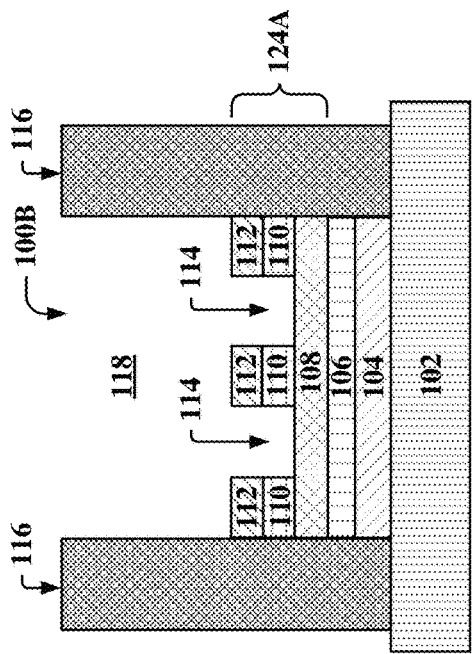
FIG. 1B illustrates a cross-sectional side view of an example, non-limiting device that facilitates hybrid under-bump metallization components in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problem with existing superconducting quantum circuits and/or flip chip packaged quantum devices not facilitating both superconducting interconnection between, and robust mechanical coupling of, various components of such circuits and/or devices, the present disclosure can be implemented to produce a solution to this problem in the form of a hybrid under-bump metallization component that can comprise a superconducting interconnection component and an intermetallic compound layer. An advantage of such a device is that it can facilitate superconducting interconnection between, and robust mechanical coupling of, various components of a superconducting quantum circuit and/or flip chip packaged quantum device.

Further, given the above problem with existing superconducting quantum circuits and/or flip chip packaged quantum devices not comprising a hermetically sealed superconducting interconnection between, and robust mechanical coupling of, various components of such circuits and/or devices, the present disclosure can be implemented to produce a solution to this problem in the form of a hybrid under-bump metallization component that can comprise a hermetically sealed superconducting interconnection component and an intermetallic compound layer. An advantage of such a device is that it can eliminate oxide formation (e.g., oxidation) between various components of a superconducting quantum circuit and/or flip chip packaged quantum device that can be coupled by such hermetically sealed superconducting interconnect component, thereby facilitating improved electrical coupling between such components.

FIGS. 1A-1D illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 1A-1D can be implemented to fabricate device 100D (depicted in FIG. 1D), which can comprise an under-bump metallization component 124B in accordance with one or more embodiments described herein.

According to multiple embodiments, the subject disclosure described herein and/or illustrated in the figures (e.g., device 100D, under-bump metallization component 124B, etc.) can constitute one or more components of a superconducting quantum circuit and/or a superconducting quantum device (e.g., a quantum computing device, quantum computing hardware, etc.). In some embodiments, the subject disclosure described herein and/or illustrated in the figures (e.g., device 100D, under-bump metallization component 124B, etc.) can be fabricated in a semiconductor device utilizing one or more techniques for fabricating an integrated circuit.

As described below with reference to FIGS. 1A-1D, fabrication of the various embodiments of the subject disclosure described herein and/or illustrated in the figures (e.g., device 100D, under-bump metallization component 124B, etc.) can comprise a multi-step sequence of, for example, photolithographic and/or chemical processing steps that facilitate gradual creation of electronic-based (e.g., microelectronic-based) systems, devices, components, and/or circuits on one or more substrate layers. For instance, the various embodiments of the subject disclosure described herein and/or illustrated in the figures (e.g., device 100D, under-bump metallization component 124B, etc.) can be fabricated by employing techniques including, but not limited to: photolithography, microlithography, nanolithography, nanoimprint lithography, photomasking techniques, patterning techniques, photoresist techniques, etching techniques (e.g., reactive ion etching (RIE), dry etching, wet etching, etc.), evaporation techniques, sputtering techniques, plasma ashing techniques, thermal treatments (e.g., rapid thermal anneal, furnace anneals, thermal oxidation, etc.), chemical vapor deposition (CVD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 1A-1D, fabrication of the various embodiments of the subject disclosure described herein and/or illustrated in the figures (e.g., device 100D, under-bump metallization component 124B, etc.) can be fabricated using various materials. For example, the various embodiments of the subject disclosure described herein and/or illustrated in the figures (e.g., device 100D, under-bump metallization component 124B, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 1D:
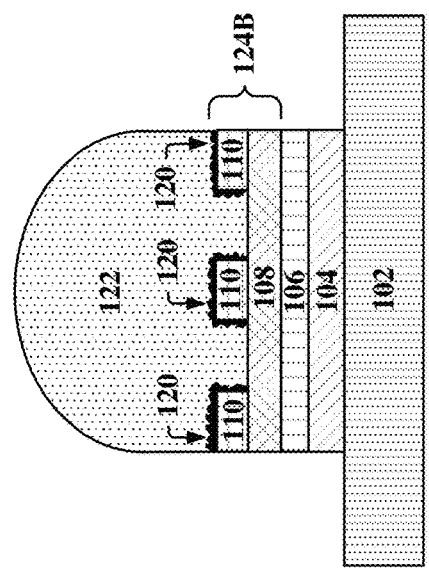
FIG. 1D illustrates a cross-sectional side view of an example, non-limiting device that facilitates hybrid under-bump metallization components in accordance with one or more embodiments described herein.
Figure 1A:
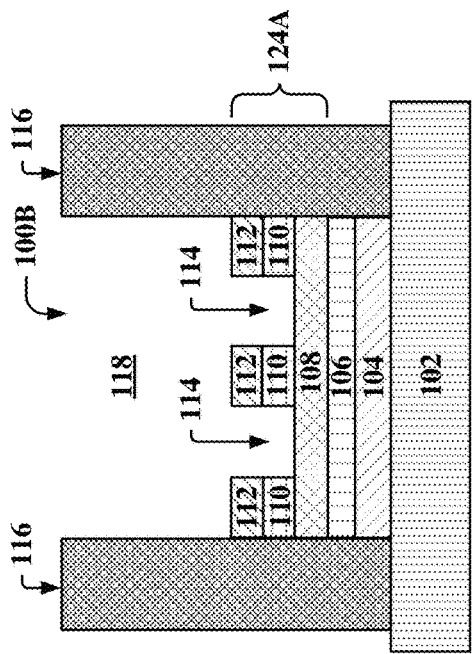
FIG. 1A illustrates a cross-sectional side view of an example, non-limiting device that facilitates hybrid under-bump metallization components in accordance with one or more embodiments described herein.

FIG. 1A illustrates a cross-sectional side view of an example, non-limiting device 100A that facilitates hybrid under-bump metallization components in accordance with one or more embodiments described herein. According to several embodiments, device 100A can comprise a substrate 102, a first superconducting layer 104, a second superconducting layer 106 (which can protect oxidation of first superconducting layer 104), a third superconducting layer 108 (which can improve adhesion between second superconducting layer 106 and solder diffusion layer 110), a solder diffusion layer 110, and/or a solder wetting layer 112.

According to multiple embodiments, substrate 102 can comprise a semiconductor material. For example, substrate 102 can comprise silicon (Si), sapphire (e.g., aluminum oxide ($Al_2O_3$)), and/or another semiconductor material. For instance, substrate 102 can comprise silicon (Si), sapphire (e.g., aluminum oxide ($Al_2O_3$)), and/or another semiconductor material that can reduce dielectric loss tangent at low temperatures.

In some embodiments, substrate 102 can comprise any thickness that ensures mechanical stability of all material layers and/or components coupled to substrate 102. For example, substrate 102 can be ground (e.g., via backgrinding) to a thickness (e.g., height) ranging from 10 micrometers (μm)-1,000 μm.

According to multiple embodiments, first superconducting layer 104 can comprise a superconducting material. For example, first superconducting layer 104 can comprise niobium (Nb), aluminum (Al), rhenium (Re), tungsten (W), diamond, and/or another superconducting material.

In some embodiments, first superconducting layer 104 can be coupled to substrate 102. For example, first superconducting layer 104 can be coupled (e.g., electrically, mechanically, operatively, chemically, etc.) to a top side of substrate 102. In some embodiments, to facilitate such coupling, first superconducting layer 104 can be deposited on a top side of substrate 102. For example, first superconducting layer 104 can be deposited on a top side of substrate 102 by employing techniques including, but not limited to, physical vapor deposition (PVD), sputtering, evaporation, and/or another technique to deposit first superconducting layer 104 onto substrate 102 as illustrated in FIG. 1A. In some embodiments, first superconducting layer 104 can be deposited (e.g., via PVD, sputtering, evaporation, etc.) onto substrate 102 such that first superconducting layer 104 can comprise a thickness (e.g., height) ranging, for example, from 50 nanometers (nm)-500 nm.

In some embodiments, first superconducting layer 104 can comprise a superconducting interconnect component. For example, first superconducting layer 104 can comprise a superconducting interconnect component that can couple (e.g., electrically, operatively, etc.) substrate 102 to second superconducting layer 106.

According to multiple embodiments, second superconducting layer 106 can comprise a superconducting material. For example, second superconducting layer 106 can comprise titanium nitride (TiN), niobium nitride (NbN), titanium-niobium-nitride (TiNbN), silicide, and/or another superconducting material.

In some embodiments, second superconducting layer 106 can be coupled to first superconducting layer 104. For example, second superconducting layer 106 can be coupled (e.g., electrically, mechanically, operatively, chemically, etc.) to a top side of first superconducting layer 104. In some embodiments, to facilitate such coupling, second superconducting layer 106 can be deposited on a top side of first superconducting layer 104 without breaking vacuum, thereby preventing oxidation of first super conducting layer 104. For example, second superconducting layer 106 can be deposited on a top side of first superconducting layer 104 by employing techniques including, but not limited to, PVD, sputtering, evaporation, and/or another technique to deposit second superconducting layer 106 onto first superconducting layer 104 as illustrated in FIG. 1A. In some embodiments, second superconducting layer 106 can be deposited (e.g., via PVD, sputtering, evaporation, etc.) onto first superconducting layer 104 such that second superconducting layer 106 can comprise a thickness (e.g., height) ranging, for example, from 1 nm-100 nm.

In some embodiments, second superconducting layer 106 can comprise a superconducting interconnect component. For example, second superconducting layer 106 can comprise a superconducting interconnect component that can couple (e.g., electrically, operatively, etc.) first superconducting layer 104 to third superconducting layer 108. In another example, second superconducting layer 106 can comprise a superconducting interconnect component that can couple (e.g., electrically, operatively, etc.) first superconducting layer 104 to solder bump 122 (e.g., as described below with reference to FIGS. 2A-2D).

In some embodiments, second superconducting layer 106 can comprise a wire bonding layer. For example, second superconducting layer 106 can comprise a wire bonding layer that can couple (e.g., electrically, operatively, etc.) first superconducting layer 104 to third superconducting layer 108. In another example, second superconducting layer 106 can comprise a wire bonding layer that can couple (e.g., electrically, operatively, etc.) first superconducting layer 104 to solder bump 122 (e.g., as described below with reference to FIGS. 2A-2D).

In some embodiments, second superconducting layer 106 can comprise an oxidation barrier layer. For example, second superconducting layer 106 can comprise an oxidation barrier layer that can prevent oxidation of first superconducting layer 104.

According to multiple embodiments, third superconducting layer 108 can comprise a superconducting material. For example, third superconducting layer 108 can comprise superconducting materials including, but not limited to, titanium (Ti), tantalum (Ta), tungsten (W), aluminum (Al), and/or another superconducting material.

In some embodiments, third superconducting layer 108 can be coupled to second superconducting layer 106. For example, third superconducting layer 108 can be coupled (e.g., electrically, mechanically, operatively, chemically, etc.) to a top side of second superconducting layer 106. In some embodiments, to facilitate such coupling, third superconducting layer 108 can be deposited on a top side of second superconducting layer 106. For example, third superconducting layer 108 can be deposited on a top side of second superconducting layer 106 by employing techniques including, but not limited to, PVD, sputtering, evaporation, and/or another technique to deposit third superconducting layer 108 onto second superconducting layer 106 as illustrated in FIG. 1A. In some embodiments, third superconducting layer 108 can be deposited (e.g., via PVD, sputtering, evaporation, etc.) onto second superconducting layer 106 such that third superconducting layer 108 can comprise a thickness (e.g., height) ranging, for example, from 5 nm-500 nm.

In some embodiments, third superconducting layer 108 can comprise a superconducting interconnect component. For example, third superconducting layer 108 can comprise a superconducting interconnect component that can couple (e.g., electrically, operatively, etc.) second superconducting layer 106 to solder diffusion layer 110 and/or solder bump 122 as described below with reference to FIGS. 1C & 1D. In some embodiments, third superconducting layer 108 can comprise an adhesion layer. For example, third superconducting layer 108 can comprise an adhesion layer that can provide improved adhesion between second superconducting layer 106 and solder diffusion layer 110.

According to multiple embodiments, solder diffusion layer 110 can comprise a material that can react with solder to form an intermetallic compound layer, where solder diffusion layer 110 can be partially consumed (not completely consumed) by the reaction with solder. For example, solder diffusion layer 110 can comprise materials including, but not limited to, platinum (Pt), palladium (Pd), nickel (Ni), copper (Cu), indium (In), tin (Sn), and/or another material that can react with solder (e.g., solder bump 122 as described below with reference to FIG. 1C) to form an intermetallic compound layer (e.g., intermetallic compound layer 120 as described below with reference to FIG. 1C), but not totally consumed after reaction with solder (e.g., part of solder diffusion layer 110 is still shown FIG. 1C after forming intermetallic compound layer 120).

In some embodiments, solder diffusion layer 110 can be coupled to third superconducting layer 108. For example, solder diffusion layer 110 can be coupled (e.g., electrically, mechanically, operatively, chemically, etc.) to a top side of third superconducting layer 108. In some embodiments, to facilitate such coupling, solder diffusion layer 110 can be deposited on a top side of third superconducting layer 108. For example, solder diffusion layer 110 can be deposited on a top side of third superconducting layer 108 by employing techniques including, but not limited to, PVD, sputtering, evaporation, and/or another technique to deposit solder diffusion layer 110 onto third superconducting layer 108 as illustrated in FIG. 1A. In some embodiments, solder diffusion layer 110 can be deposited (e.g., via PVD, sputtering, evaporation, etc.) onto third superconducting layer 108 such that solder diffusion layer 110 can comprise a thickness (e.g., height) ranging, for example, from 5 nm-1000 nm.

In some embodiments, solder diffusion layer 110 can comprise an oxidation barrier layer. For example, solder diffusion layer 110 can comprise an oxidation barrier layer that can prevent oxidation of third superconducting layer 108. In some embodiments, solder diffusion layer 110 can comprise a solder wetting layer that can react with solder to form an intermetallic compound layer. For example, solder diffusion layer 110 can comprise a solder wetting layer that can react with solder (e.g., solder bump 122 as described below with reference to FIG. 1C) to form an intermetallic compound layer (e.g., intermetallic compound layer 120 as described below with reference to FIG. 1C).

According to multiple embodiments, solder wetting layer 112 can comprise a solder wetting material that can react with molten solder to mix into solder. In some embodiments, solder wetting layer 112 should not be oxidized before contacting solder. For example, solder wetting layer 112 can comprise gold (Au) and/or another solder wetting material that can react with molten solder (e.g., solder bump 122 as described below with reference to FIG. 1C) to mix into solder and allow formation of an intermetallic compound layer between solder bump 122 and solder diffusion layer 110 (e.g., solder wetting layer 112 in FIG. 1B is not shown in FIG. 1C).

In some embodiments, solder wetting layer 112 can be coupled to solder diffusion layer 110. For example, solder wetting layer 112 can be coupled (e.g., electrically, mechanically, operatively, chemically, etc.) to a top side of solder diffusion layer 110. In some embodiments, to facilitate such coupling, solder wetting layer 112 can be deposited on a top side of solder diffusion layer 110. For example, solder wetting layer 112 can be deposited on a top side of solder diffusion layer 110 by employing techniques including, but not limited to, PVD, sputtering, evaporation, and/or another technique to deposit solder wetting layer 112 onto solder diffusion layer 110 as illustrated in FIG. 1A. In some embodiments, solder wetting layer 112 can be deposited (e.g., via PVD, sputtering, evaporation, etc.) onto solder diffusion layer 110 such that solder wetting layer 112 can comprise a thickness (e.g., height) ranging, for example, from 5 nm-1000 nm.

In some embodiments, solder wetting layer 112 can comprise an oxidation barrier layer. For example, solder wetting layer 112 can comprise an oxidation barrier layer that can prevent oxidation of solder diffusion layer 110.

FIG. 1B illustrates a cross-sectional side view of an example, non-limiting device 100B that facilitates hybrid under-bump metallization components in accordance with one or more embodiments described herein. Repetitive description of like elements employed in other embodiments described herein is omitted for sake of brevity. According to several embodiments, device 100B can comprise one or more channels 114, a photoresist layer 116, an opening 118, and/or under-bump metallization component 124A.

According to multiple embodiments, channel 114 can be formed through solder wetting layer 112 and solder diffusion layer 110 of device 100A to form device 100B. For example, channel 114 can be formed through solder wetting layer 112 and solder diffusion layer 110 such that a top surface of third superconducting layer 108 is exposed (e.g., as illustrated in the embodiment depicted in FIG. 1B). In some embodiments, channel 114 can be formed through solder wetting layer 112 and solder diffusion layer 110 by employing one or more photoresist techniques, photomasking techniques, patterning techniques, and/or etching techniques on device 100A. For example, channel 114 can be formed through solder wetting layer 112 and solder diffusion layer 110 by: applying a photomask and/or photoresist to the top surface of solder wetting layer 112 such that a desired geometric pattern of channel 114 (e.g., a two-dimensional (2D) shape of channel 114) can be superimposed onto the top surface of solder wetting layer 112; and etching (e.g., via RIE, dry etching, wet etching, etc.) the desired geometric pattern of channel 114 into and through solder wetting layer 112 and solder diffusion layer 110 such that the top surface of third superconducting layer 108 is exposed (e.g., as illustrated in the embodiment depicted in FIG. 1B).

In some embodiments, channel 114 can comprise a variety of shapes. For instance, the shape of channel 114 can be defined in the 2D plane extending along the X-axis and Z-axis of FIGS. 1A-1D, which can be observed in a top view of device 100B (e.g., as presented in the example embodiments illustrated in FIGS. 3A-3D). In some embodiments, channel 114 can be etched through solder wetting layer 112 and solder diffusion layer 110 in such a manner to form shapes including, but not limited to, a ring, a square, a rectangle, a circle, a hexagon, an octagon, a diamond, and/or another shape that can be defined in such a 2D plane extending along the X-axis and Z-axis of FIGS. 1A-1D.

According to multiple embodiments, photoresist layer 116 can comprise various types of photoresist materials. For example, photoresist layer 116 can comprise photoresist materials including, but not limited to, a dry film photoresist, a liquid photoresist, and/or another type of photoresist.

In some embodiments, photoresist layer 116 can be applied to substrate 102 such that photoresist layer 116 can form a wall structure surrounding (e.g., enclosing, containing, etc.) the various material layers deposited on substrate 102 (e.g., first superconducting layer 104, second superconducting layer 106, third superconducting layer 108, solder diffusion layer 110, and/or solder wetting layer 112). In some embodiments, photoresist layer 116 can be applied to substrate 102 such that photoresist layer 116 can form a wall structure surrounding the various material layers deposited on substrate 102 and opening 118 (e.g., as illustrated in the embodiment depicted in FIG. 1B). In some embodiments, photoresist layer 116 can be applied to substrate 102 such that photoresist layer 116 can comprise a thickness (e.g., height) ranging, for example, from 10 μm-200 μm.

According to multiple embodiments, under-bump metallization component 124A can comprise one or more material layers of device 100B. For example, under-bump metallization component 124A can comprise third superconducting layer 108, solder diffusion layer 110, and/or solder wetting layer 112.

Figure 1C:
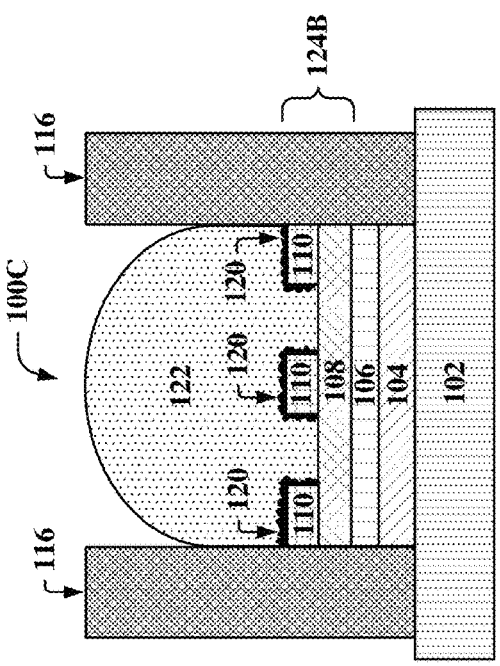
FIG. 1C illustrates a cross-sectional side view of an example, non-limiting device that facilitates hybrid under-bump metallization components in accordance with one or more embodiments described herein.

FIG. 1C illustrates a cross-sectional side view of an example, non-limiting device 100C that facilitates hybrid under-bump metallization components in accordance with one or more embodiments described herein. Repetitive description of like elements employed in other embodiments described herein is omitted for sake of brevity. According to several embodiments, device 100C can comprise one or more intermetallic compound layers 120, a solder bump 122, and/or an under-bump metallization component 124B.

According to multiple embodiments, molten solder such as, for example, injection molded solder (IMS), can be injected onto device 100B and into channel 114 to form device 100C. For example, injection molded solder (IMS) can be injected onto device 100B and into channel 114 by employing a fill head device (not illustrated in FIGS. 1A-1D) that can inject such IMS into opening 118 of device 100B to fill a volume enclosed by photoresist layer 116 (e.g., as illustrated in the embodiments depicted in FIGS. 1B & 1C). In some embodiments, the IMS can comprise various types of solder materials. For example, the IMS can comprise solder materials including, but not limited to, indium (In), bismuth (Bi), tin (Sn), lead-tin (PbSn), indium-bismuth-tin alloy (InBiSn), indium-tin alloy (InSn), and/or another material. In some embodiments, the IMS can comprise cryogenic comparable solders.

In some embodiments, injection of molten solder (e.g., IMS) onto device 100B and into channel 114 (e.g., as described above) can facilitate formation of intermetallic compound layers 120. For example, solder wetting layer 112 and solder diffusion layer 110 can react with the IMS to facilitate formation of intermetallic compound layers 120. For instance, solder wetting layer 112 can comprise gold (Au) that can diffuse into the IMS and solder diffusion layer 110 can comprise platinum (Pt), palladium (Pd), nickel (Ni), and/or another material, that can react with, for example, indium (In) of the IMS to facilitate formation of intermetallic compound layers 120.

In some embodiments, solder wetting layer 112 can be completely consumed by the molten solder (e.g., IMS) that can be injected onto device 100B and into channel 114 (e.g., as described above), which can facilitate formation of intermetallic compound layers 120. For example, all the material (e.g., Au) of solder wetting layer 112 can diffuse into the IMS to facilitate formation of intermetallic compound layers 120. In some embodiments, solder diffusion layer 110 can be partially consumed by the molten solder (e.g., IMS) that can be injected onto device 100B and into channel 114 (e.g., as described above), which can further facilitate formation of intermetallic compound layers 120. For example, some of the material (e.g., Pt, Pd, Ni, etc.) of solder diffusion layer 110 can react with the IMS (e.g., the indium (In) in the IMS) to facilitate formation of intermetallic compound layers 120. In some embodiments, based on injection of the IMS onto device 100B and into channel 114 (e.g., as described above), intermetallic compound layers 120 can therefore comprise materials of, for example, the IMS, solder diffusion layer 110, solder wetting layer 112, and/or solder bump 122, which can form from the IMS (e.g., as described below).

In some embodiments, injection of molten solder (e.g., IMS) onto device 100B and into channel 114 (e.g., as described above) can facilitate formation of solder bump 122. For example, IMS injected onto device 100B and into channel 114 can solidify as depicted in FIG. 1C, thereby facilitating formation of solder bump 122 due to surface tension of the IMS.

In some embodiments, injection of molten solder (e.g., IMS) onto device 100B and into channel 114 (e.g., as described above) can facilitate formation of under-bump metallization component 124B. For example, IMS injected onto device 100B and into channel 114 can facilitate formation of intermetallic compound layers 120 (e.g., as described above). In this example, based on such formation of intermetallic compound layers 120, formation of under-bump metallization component 124B can be complete, as under-bump metallization component 124B can comprise third superconducting layer 108, solder diffusion layer 110, and/or intermetallic compound layers 120.

In some embodiments, under-bump metallization component 124B can comprise a hybrid under-bump metallization component. For example, under-bump metallization component 124B can comprise a hybrid under-bump metallization component that can comprise a mechanical interconnect component (e.g., solder diffusion layer 110, solder wetting layer 112, and/or intermetallic compound layers 120 as described below) and a hermetically sealed superconducting interconnect component (e.g., via a hermitic seal of third superconducting layer 108 by solder bump 122 as described below).

In some embodiments, intermetallic compound layers 120 can constitute mechanical interconnect components that can mechanically couple solder bump 122 to one or more components of device 100C. For example, intermetallic compound layers 120 can mechanically couple solder bump 122 to third superconducting layer 108, solder diffusion layer 110, solder wetting layer 112, and/or under-bump metallization component 124B. It should be appreciated that such mechanical coupling can facilitate improved mechanical integrity of device 100C (and/or device 100D), which can be an advantage of the subject disclosure over prior art. It should also be appreciated that such mechanical coupling can facilitate improved strength of the mechanical connection of solder bump 122 to under-bump metallization component 124B, thereby facilitating improved electrical coupling of such components (e.g., improved electrical connection consistency), which can be an advantage of the subject disclosure over prior art.

In some embodiments, under-bump metallization component 124B, can comprise a hermetically sealed superconducting interconnect component. For example, based on injection of IMS onto device 100B and into channel 114 (e.g., as described above), the IMS that fills channel 114 can hermetically seal the top surface of third superconducting layer 108, which can thereby constitute a hermetically sealed superconducting interconnect component (e.g., hermetically sealed by solder bump 122). It should be appreciated that such hermetic sealing can prevent oxide formation (e.g., oxidation) between third superconducting layer 108 and solder bump 122, thereby facilitating improved electrical coupling of such components, which can be an advantage of the subject disclosure over prior art.

FIG. 1D illustrates a cross-sectional side view of an example, non-limiting device 100D that facilitates hybrid under-bump metallization components in accordance with one or more embodiments described herein. Repetitive description of like elements employed in other embodiments described herein is omitted for sake of brevity.

According to multiple embodiments, device 100D can comprise device 100C without photoresist layer 116. For example, based on solidification of the IMS that facilitates formation of intermetallic compound layers 120, solder bump 122, and/or under-bump metallization component 124B (e.g., as described above), photoresist layer 116 can be stripped (e.g., via RIE, dry etching, wet etching, etc.) from device 100C to form device 100D.

FIGS. 2A-2D illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 2A-2D can be implemented to fabricate device 200D (depicted in FIG. 2D), which can comprise an under-bump metallization component 204B in accordance with one or more embodiments described herein.

According to multiple embodiments, the example, non-limiting multi-step fabrication sequence illustrated in FIGS. 2A-2D can comprise an alternative example fabrication sequence of the fabrication sequence described above with reference to FIGS. 1A-1D. For instance, the fabrication sequence illustrated in FIGS. 2A-2D can be implemented to fabricate alternative example embodiments of devices 100A, 100B, 100C, and/or 100D (e.g., as described below).

Figure 2A:
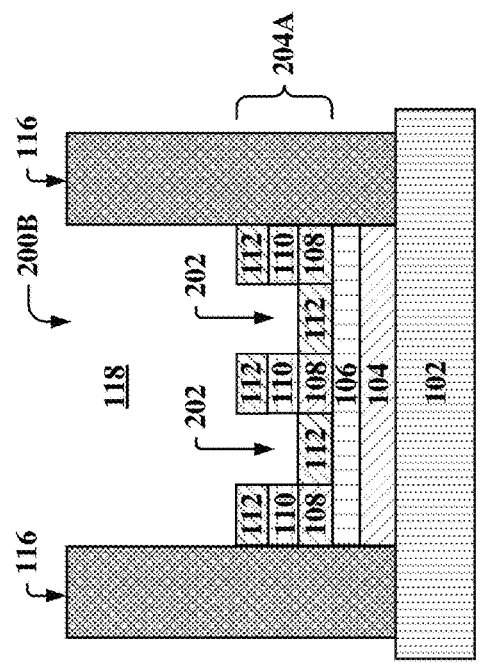
FIG. 2A illustrates a cross-sectional side view of an example, non-limiting device that facilitates hybrid under-bump metallization components in accordance with one or more embodiments described herein.

FIG. 2A illustrates a cross-sectional side view of an example, non-limiting device 200A that facilitates hybrid under-bump metallization components in accordance with one or more embodiments described herein. Repetitive description of like elements employed in other embodiments described herein is omitted for sake of brevity.

According to several embodiments, device 200A can comprise an alternative example embodiment of device 100A, where device 200A does not comprise solder wetting layer 112. Additionally or alternatively, in some embodiments, the fabrication sequence described above with reference to FIG. 1A that can be implemented to fabricate device 100A can also be implemented to fabricate device 200A, where deposition of solder wetting layer 112 can be omitted from such fabrication sequence to form device 200A.

Figure 2B:
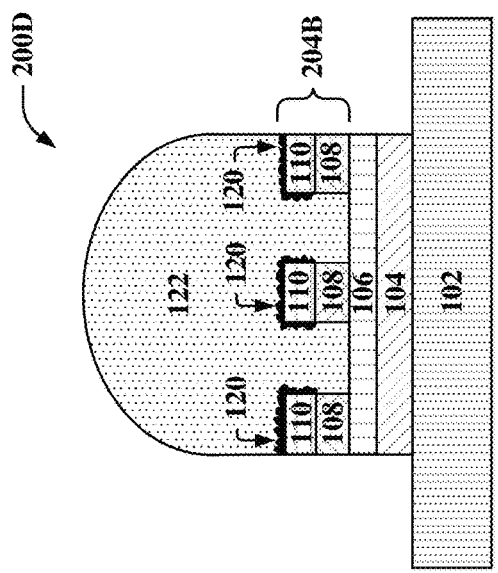
FIG. 2B illustrates a cross-sectional side view of an example, non-limiting device that facilitates hybrid under-bump metallization components in accordance with one or more embodiments described herein.

FIG. 2B illustrates a cross-sectional side view of an example, non-limiting device 200B that facilitates hybrid under-bump metallization components in accordance with one or more embodiments described herein. Repetitive description of like elements employed in other embodiments described herein is omitted for sake of brevity.

According to several embodiments, device 200B can comprise an alternative example embodiment of device 100B described above with reference to FIG. 1B. In some embodiments, device 200B can comprise one or more channels 202. In some embodiments, device 200B can comprise solder wetting layer 112 deposited on solder diffusion layer 110 and second superconducting layer 106 (e.g., as illustrated in the embodiment depicted in FIG. 2B). In some embodiments, device 200B can comprise under-bump metallization component 204A, which can comprise an alternative example embodiment of under-bump metallization component 124A of FIG. 1B.

According to multiple embodiments, channel 202 can comprise an alternative example embodiment of channel 114 described above with reference to device 100B and FIG. 1B, where channel 202 can be formed through solder diffusion layer 110 and third superconducting layer 108 of device 200A to expose a top surface of second superconducting layer 106. For example, channel 202 can be formed through solder diffusion layer 110 and third superconducting layer 108 by: applying a photomask and/or photoresist to the top surface of solder diffusion layer 110 such that a desired geometric pattern of channel 202 (e.g., a two-dimensional (2D) shape of channel 202) can be superimposed onto the top surface of solder diffusion layer 110; and etching (e.g., via RIE, dry etching, wet etching, etc.) the desired geometric pattern of channel 202 into and through solder diffusion layer 110 and third superconducting layer 108 such that the top surface of second superconducting layer 106 is exposed.

In some embodiments, based on formation of channel 202, solder wetting layer 112 can be deposited on a top surface of solder diffusion layer 110 and a top surface of second superconducting layer 106. For example, based on formation of channel 202, solder wetting layer 112 can be deposited on the top surface of solder diffusion layer 110 and the top surface of second superconducting layer 106 by employing techniques including, but not limited to, PVD, sputtering, evaporation, and/or another technique to deposit solder wetting layer 112 onto solder diffusion layer 110 and second superconducting layer 106 as illustrated in FIG. 2B. In some embodiments, solder wetting layer 112 can be deposited (e.g., via PVD, sputtering, evaporation, etc.) onto solder diffusion layer 110 and second superconducting layer 106 second superconducting layer 106 such that solder wetting layer 112 can comprise a thickness (e.g., height) ranging, for example, from 5 nm-1000 nm.

In some embodiments, solder wetting layer 112 can comprise an oxidation barrier layer. For example, solder wetting layer 112 can comprise an oxidation barrier layer that can prevent oxidation of solder diffusion layer 110 and/or second superconducting layer 106.

Figure 2C:
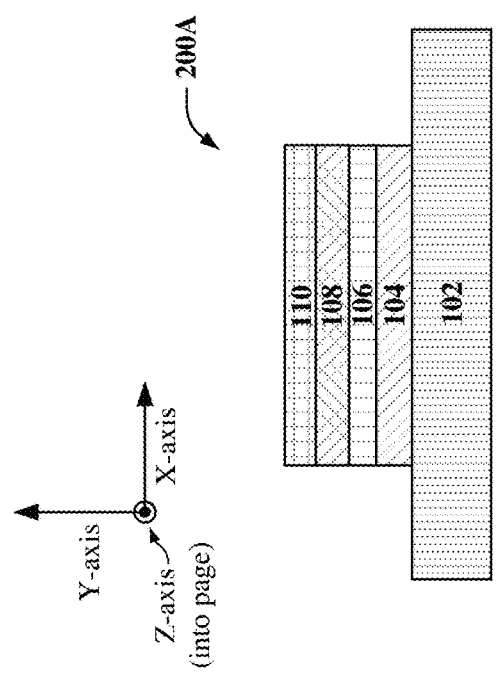
FIG. 2C illustrates a cross-sectional side view of an example, non-limiting device that facilitates hybrid under-bump metallization components in accordance with one or more embodiments described herein.

FIG. 2C illustrates a cross-sectional side view of an example, non-limiting device 200C that facilitates hybrid under-bump metallization components in accordance with one or more embodiments described herein. Repetitive description of like elements employed in other embodiments described herein is omitted for sake of brevity.

According to several embodiments, device 200C can comprise an alternative example embodiment of device 100C, where device 200C comprises under-bump metallization component 204B, which can comprise an alternative example embodiment of under-bump metallization component 124B of FIG. 1C. Additionally or alternatively, in some embodiments, the fabrication sequence described above with reference to FIG. 1C that can be implemented to fabricate device 100C can also be implemented to fabricate device 200C. For example, molten solder (e.g., IMS) can be injected onto device 200B and into channel 202 to facilitate formation of intermetallic compound layers 120, solder bump 122, and/or under-bump metallization component 204B of device 200C.

In some embodiments, intermetallic compound layers 120 of under-bump metallization component 204B can constitute mechanical interconnect components that can mechanically couple solder bump 122 to, for example, second superconducting layer 106, third superconducting layer 108, solder diffusion layer 110, solder wetting layer 112, and/or under-bump metallization component 204B. In some embodiments, based on injection of IMS onto device 200B and into channel 202 (e.g., as described above), the IMS that fills channel 202 can hermetically seal one or more side surfaces of third superconducting layer 108 and the top surface of second superconducting layer 106, which can thereby constitute hermetically sealed superconducting interconnect components (e.g., hermetically sealed by solder bump 122).

Figure 2D:
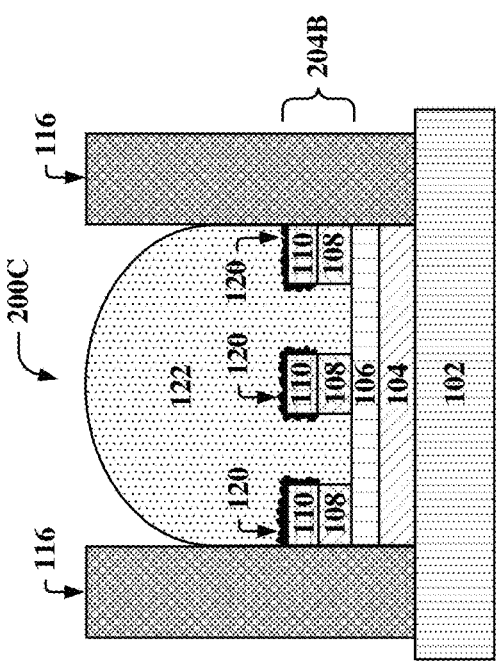
FIG. 2D illustrates a cross-sectional side view of an example, non-limiting device that facilitates hybrid under-bump metallization components in accordance with one or more embodiments described herein.

FIG. 2D illustrates a cross-sectional side view of an example, non-limiting device 200D that facilitates hybrid under-bump metallization components in accordance with one or more embodiments described herein. Repetitive description of like elements employed in other embodiments described herein is omitted for sake of brevity.

According to multiple embodiments, device 200D can comprise device 200C without photoresist layer 116. For example, based on solidification of the IMS that facilitates formation of intermetallic compound layers 120, solder bump 122, and/or under-bump metallization component 204B (e.g., as described above), photoresist layer 116 can be stripped (e.g., via RIE, dry etching, wet etching, etc.) from device 200C to form device 200D.

Figure 3A:
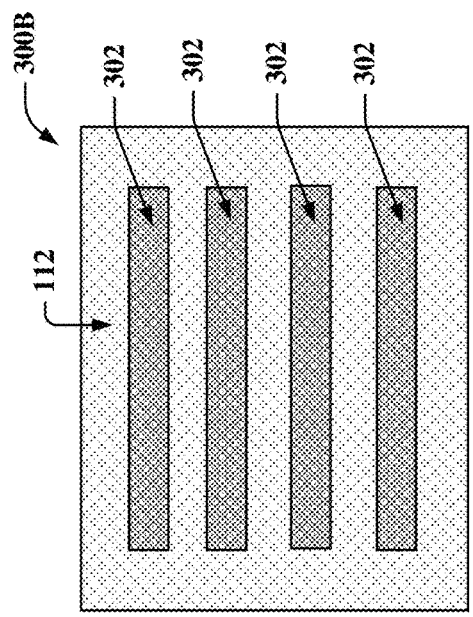
FIG. 3A illustrates a top view of an example, non-limiting device that facilitates hybrid under-bump metallization components in accordance with one or more embodiments described herein.

FIG. 3A illustrates a top view of an example, non-limiting device 300A that facilitates hybrid under-bump metallization components in accordance with one or more embodiments described herein. According to multiple embodiments, device 300A can comprise device 100B or device 200B of FIG. 1B and FIG. 2B, respectively, where photoresist layer 116 is not depicted in FIG. 3A for purposes of clarity. In FIG. 3A, dashed line 304 indicates where the cross-sectional side view of device 100A and device 100B occurs relative to device 300A. Repetitive description of like elements employed in other embodiments described herein is omitted for sake of brevity.

According to multiple embodiments, device 300A can comprise layer 302, which can comprise third superconducting layer 108 or solder wetting layer 112. For example, device 300A can comprise device 100B of FIG. 1B, and in such an embodiment, layer 302 can comprise third superconducting layer 108. In another example, device 300A can comprise device 200B of FIG. 2B and in such an embodiment, layer 302 can comprise solder wetting layer 112.

Figure 3B:
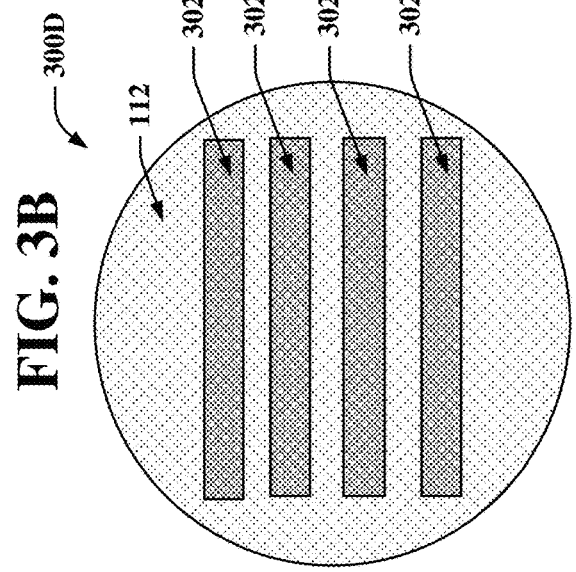
FIG. 3B illustrates a top view of an example, non-limiting device that facilitates hybrid under-bump metallization components in accordance with one or more embodiments described herein.

FIG. 3B illustrates a top view of an example, non-limiting device 300B that facilitates hybrid under-bump metallization components in accordance with one or more embodiments described herein. According to multiple embodiments, device 300B can comprise an alternative example embodiment of device 100B of FIG. 1B, device 200B of FIG. 2B, and/or device 300A of FIG. 3A. Repetitive description of like elements employed in other embodiments described herein is omitted for sake of brevity.

Figure 3C:
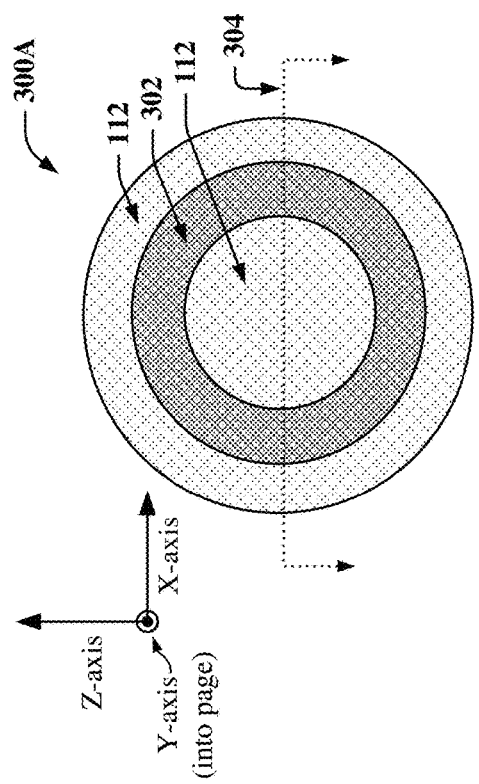
FIG. 3C illustrates a top view of an example, non-limiting device that facilitates hybrid under-bump metallization components in accordance with one or more embodiments described herein.

FIG. 3C illustrates a top view of an example, non-limiting device 300C that facilitates hybrid under-bump metallization components in accordance with one or more embodiments described herein. According to multiple embodiments, device 300C can comprise an alternative example embodiment of device 100B of FIG. 1B, device 200B of FIG. 2B, and/or device 300A of FIG. 3A. Repetitive description of like elements employed in other embodiments described herein is omitted for sake of brevity.

Figure 3D:
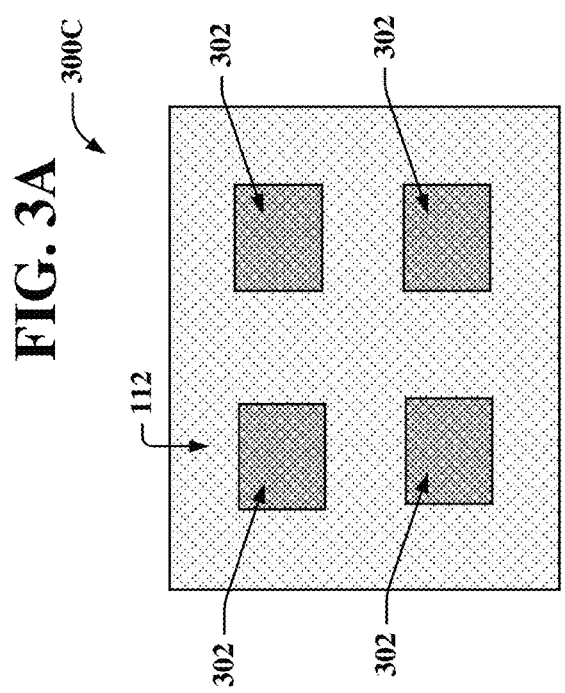
FIG. 3D illustrates a top view of an example, non-limiting device that facilitates hybrid under-bump metallization components in accordance with one or more embodiments described herein.

FIG. 3D illustrates a top view of an example, non-limiting device 300D that facilitates hybrid under-bump metallization components in accordance with one or more embodiments described herein. According to multiple embodiments, device 300D can comprise an alternative example embodiment of device 100B of FIG. 1B, device 200B of FIG. 2B, and/or device 300A of FIG. 3A. Repetitive description of like elements employed in other embodiments described herein is omitted for sake of brevity.

In some embodiments, under-bump metallization component 124B and/or under-bump metallization component 204B can comprise a hybrid under-bump metallization component, device, system, and/or process associated with various technologies. For example, can be associated with quantum bit (qubit) technologies, quantum circuit technologies, superconducting circuit technologies, circuit quantum electrodynamics (cQED) technologies, quantum computing technologies, quantum processor technologies, superconductor device fabrication technologies, semiconductor device fabrication technologies, flip chip device technologies, semiconductor device packaging technologies, superconductor device packaging technologies, quantum hardware technologies, and/or other technologies.

In some embodiments, under-bump metallization component 124B and/or under-bump metallization component 204B can provide technical improvements to systems, devices, components, operational steps, and/or processing steps associated with the various technologies listed above. For example, under-bump metallization component 124B and/or under-bump metallization component 204B can provide a hermetically sealed superconducting interconnection (e.g., second superconducting layer 106 and/or third superconducting layer 108 hermetically sealed by solder bump 122), which can prevent oxide formation (e.g., oxidation) between components coupled to such hermetically sealed superconducting interconnection (e.g., between second superconducting layer 106 and/or third superconducting layer 108 and solder bump 122), thereby facilitating improved electrical coupling of such components. In another example, under-bump metallization component 124B and/or under-bump metallization component 204B can provide improved mechanical coupling of under-bump metallization component 124B and/or under-bump metallization component 204B to solder bump 122 (e.g., via solder diffusion layer 110, solder wetting layer 112, and/or intermetallic compound layers 120). In this example, such improved mechanical coupling can facilitate improved mechanical integrity of a flip chip device comprising under-bump metallization component 124B and/or under-bump metallization component 204B (e.g., a quantum bit (qubit) chip, quantum hardware, superconducting quantum processor, quantum computing device, etc.).

In some embodiments, under-bump metallization component 124B and/or under-bump metallization component 204B can provide technical improvements to a processing unit associated with under-bump metallization component 124B and/or under-bump metallization component 204B. For example, the improved electrical and mechanical coupling provided by under-bump metallization component 124B and/or under-bump metallization component 204B (e.g., as described above) can facilitate improved electrical connectivity necessary to perform processing workloads of a processing unit associated with under-bump metallization component 124B and/or under-bump metallization component 204B (e.g., a quantum processor). In this example, such improved electrical connectivity can facilitate fewer processing cycles required to complete a given processing workload, thereby facilitating improved processing efficiency and/or performance of a processing unit comprising under-bump metallization component 124B and/or under-bump metallization component 204B (e.g., a superconducting quantum processor), which can reduce power consumption by such processing unit.

In some embodiments, under-bump metallization component 124B and/or under-bump metallization component 204B can employ hardware and/or software to solve problems that are highly technical in nature, that are not abstract and that cannot be performed as a set of mental acts by a human. For example, under-bump metallization component 124B and/or under-bump metallization component 204B can facilitate hermetic sealing of a superconducting interconnection that can be employed in a flip chip device used to implement a quantum computing device that can process information and/or execute calculations based on quantum-mechanical phenomena.

It is to be appreciated that under-bump metallization component 124B and/or under-bump metallization component 204B can facilitate a superconducting interconnection process utilizing various combinations of electrical components, mechanical components, and circuitry (e.g., superconducting quantum circuits) that cannot be replicated in the mind of a human or performed by a human. For example, facilitating a superconducting interconnection that can enable operation of a quantum computing device (e.g., quantum processor, quantum computer, etc.) is operation that is greater than the capability of a human mind. For instance, the amount of data processed, the speed of processing such data, and/or the types of data processed by under-bump metallization component 124B and/or under-bump metallization component 204B over a certain period of time can be greater, faster, and/or different than the amount, speed, and/or data type that can be processed by a human mind over the same period of time.

According to several embodiments, under-bump metallization component 124B and/or under-bump metallization component 204B can also be fully operational towards performing one or more other functions (e.g., fully powered on, fully executed, etc.) while also performing the above-referenced superconducting interconnection process. It should also be appreciated that such simultaneous multi-operational execution is beyond the capability of a human mind. It should also be appreciated that under-bump metallization component 124B and/or under-bump metallization component 204B can include information that is impossible to obtain manually by an entity, such as a human user. For example, the type, amount, and/or variety of information included in under-bump metallization component 124B and/or under-bump metallization component 204B can be more complex than information obtained manually by a human user.

FIG. 4A illustrates a cross-sectional side view of an example, non-limiting device 400A that facilitates hybrid under-bump metallization components in accordance with one or more embodiments described herein. Repetitive description of like elements employed in other embodiments described herein is omitted for sake of brevity.

According to multiple embodiments, device 400A can comprise device 406 and device 200D of FIG. 2D. In some embodiments, device 406 can comprise an alternative example embodiment of device 100B of FIG. 1B, device 200B of FIG. 2B, and/or device 300A of FIG. 3A. In some embodiments, device 406 can comprise a substrate 402, which can comprise substrate 102. In some embodiments, substrate 402 can comprise a quantum bit (qubit) chip.

In some embodiments, device 406 can comprise under-bump metallization component 404A, which can comprise an alternative example embodiment of under-bump metallization component 204A of device 200B described above with reference to FIG. 2B. In some embodiments, under-bump metallization component 404A can be coupled (e.g., electrically, mechanically, operatively, chemically, etc.) to under-bump metallization component 204B. For example, to facilitate such coupling of under-bump metallization component 404A to under-bump metallization component 204B, device 406 can be coupled (e.g., electrically, mechanically, operatively, chemically, etc.) to device 200D to form device 400B (e.g., as described below with reference to FIG. 4B).

FIG. 4B illustrates a cross-sectional side view of an example, non-limiting device 400B that facilitates hybrid under-bump metallization components in accordance with one or more embodiments described herein. Repetitive description of like elements employed in other embodiments described herein is omitted for sake of brevity. According to multiple embodiments, device 400B can comprise under-bump metallization component 404B, which can comprise an alternative example embodiment of under-bump metallization component 204B.

According to multiple embodiments, device 400B can be formed by coupling (e.g., electrically, mechanically, operatively, chemically, etc.) device 406 to device 200D. For example, device 406 can be coupled (e.g., electrically, mechanically, operatively, chemically, etc.) to device 200D by employing a reflow soldering technique. For instance, heat can be applied via a heat source (not illustrated in FIGS. 4A & 4B) to solder bump 122 of device 200D such that solder bump 122 transforms from a solid state to a liquid and/or semi-liquid state (e.g., a solder reflow state). In this example, based on implementing such reflow soldering technique, under-bump metallization component 404A of device 406 can be inserted into solder bump 122, thereby facilitating formation of under-bump metallization component 404B and device 400B. In this example, implementing such reflow soldering technique and inserting under-bump metallization component 404A into solder bump 122 can facilitate formation of intermetallic compound layers 120 of under-bump metallization component 404B as illustrated in the embodiment depicted in FIG. 4B.

In some embodiments, device 400B can comprise a flip chip device. For example, device 400B can comprise a flip chip device comprising one or more hermetically sealed superconducting interconnect components (e.g., second superconducting layers 106, third superconducting layers 108, solder bump 122, etc.) and/or one or more mechanical interconnect components (e.g., solder diffusion layers 110, solder wetting layers 112, intermetallic compound layers 120, solder bump 122, etc.).

Figures 5A, 5B:
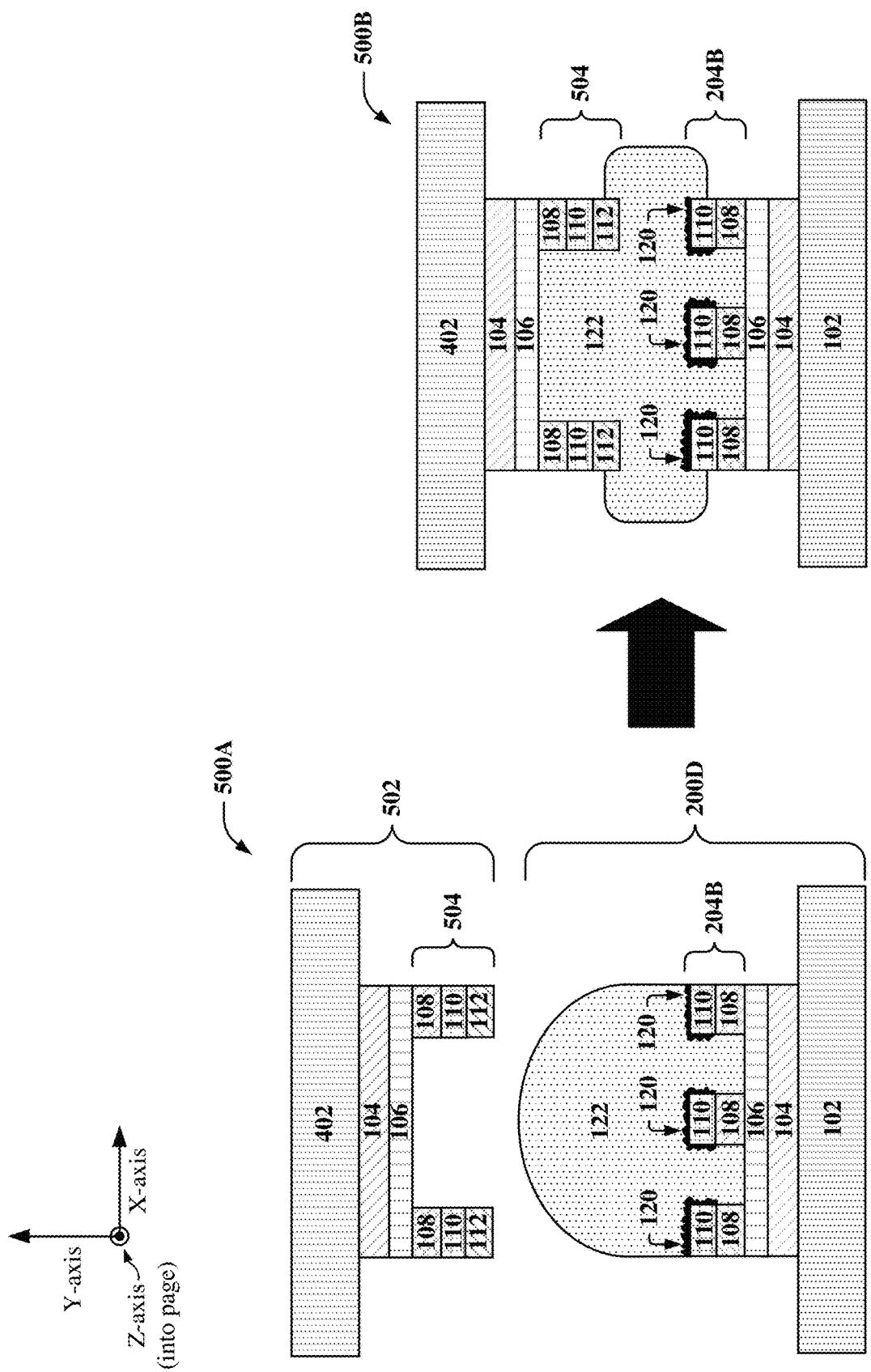
FIG. 5A illustrates a cross-sectional side view of an example, non-limiting device that facilitates hybrid under-bump metallization components in accordance with one or more embodiments described herein.
FIG. 5B illustrates a cross-sectional side view of an example, non-limiting device that facilitates hybrid under-bump metallization components in accordance with one or more embodiments described herein.

FIG. 5A illustrates a cross-sectional side view of an example, non-limiting device 500A that facilitates hybrid under-bump metallization components in accordance with one or more embodiments described herein. Repetitive description of like elements employed in other embodiments described herein is omitted for sake of brevity.

According to multiple embodiments, device 500A can comprise device 502 and device 200D of FIG. 2D. In some embodiments, device 502 can comprise an alternative example embodiment of device 100B of FIG. 1B, device 200B of FIG. 2B, and/or device 300A of FIG. 3A. In some embodiments, device 502 can comprise an under-bump metallization component 504, which can comprise an alternative example embodiment of under-bump metallization component 204A of device 200B described above with reference to FIG. 2B. In some embodiments, under-bump metallization component 504 can be coupled (e.g., electrically, mechanically, operatively, chemically, etc.) to under-bump metallization component 204B. For example, to facilitate such coupling of under-bump metallization component 504 to under-bump metallization component 204B, device 502 can be coupled (e.g., electrically, mechanically, operatively, chemically, etc.) to device 200D to form device 500B (e.g., as described below with reference to FIG. 5B).

FIG. 5B illustrates a cross-sectional side view of an example, non-limiting device 500B that facilitates hybrid under-bump metallization components in accordance with one or more embodiments described herein. Repetitive description of like elements employed in other embodiments described herein is omitted for sake of brevity.

According to multiple embodiments, device 500B can be formed by coupling (e.g., electrically, mechanically, operatively, chemically, etc.) device 502 to device 200D. For example, device 502 can be coupled (e.g., electrically, mechanically, operatively, chemically, etc.) to device 200D by employing a cold welding technique (also referred to as contact welding). In this example, based on implementing such cold welding technique, under-bump metallization component 504 of device 502 can be inserted into and coupled to solder bump 122, thereby facilitating formation of device 500B and coupling (e.g., electrically, mechanically, operatively, chemically, etc.) under-bump metallization component 504 to under-bump metallization component 204A.

In some embodiments, device 500B can comprise a flip chip device. For example, device 500B can comprise a flip chip device comprising one or more hermetically sealed superconducting interconnect components (e.g., second superconducting layers 106, third superconducting layers 108, solder bump 122, etc.) and/or one or more mechanical interconnect components (e.g., solder diffusion layers 110, solder wetting layers 112, intermetallic compound layers 120, solder bump 122, etc.).

FIG. 5C illustrates a cross-sectional side view of an example, non-limiting device 500C that facilitates hybrid under-bump metallization components in accordance with one or more embodiments described herein. Repetitive description of like elements employed in other embodiments described herein is omitted for sake of brevity.

According to multiple embodiments, device 500C can comprise device 506 and device 200D of FIG. 2D. In some embodiments, device 506 can comprise an alternative example embodiment of device 100B of FIG. 1B, device 200B of FIG. 2B, and/or device 300A of FIG. 3A. In some embodiments, device 506 can comprise an under-bump metallization component 508, which can comprise an alternative example embodiment of under-bump metallization component 204A of device 200B described above with reference to FIG. 2B. In some embodiments, under-bump metallization component 508 can be coupled (e.g., electrically, mechanically, operatively, chemically, etc.) to under-bump metallization component 204B. For example, to facilitate such coupling of under-bump metallization component 508 to under-bump metallization component 204B, device 506 can be coupled (e.g., electrically, mechanically, operatively, chemically, etc.) to device 200D to form device 500D (e.g., as described below with reference to FIG. 5D).

FIG. 5D illustrates a cross-sectional side view of an example, non-limiting device 500D that facilitates hybrid under-bump metallization components in accordance with one or more embodiments described herein. Repetitive description of like elements employed in other embodiments described herein is omitted for sake of brevity.

According to multiple embodiments, device 500D can be formed by coupling (e.g., electrically, mechanically, operatively, chemically, etc.) device 506 to device 200D. For example, device 506 can be coupled (e.g., electrically, mechanically, operatively, chemically, etc.) to device 200D by employing a cold welding technique (also referred to as contact welding). In this example, based on implementing such cold welding technique, under-bump metallization component 508 of device 506 can be inserted into and coupled to solder bump 122, thereby facilitating formation of device 500D and coupling (e.g., electrically, mechanically, operatively, chemically, etc.) under-bump metallization component 508 to under-bump metallization component 204A.

In some embodiments, device 500D can comprise a flip chip device. For example, device 500D can comprise a flip chip device comprising one or more hermetically sealed superconducting interconnect components (e.g., second superconducting layers 106, third superconducting layers 108, solder bump 122, etc.) and/or one or more mechanical interconnect components (e.g., solder diffusion layers 110, solder wetting layers 112, intermetallic compound layers 120, solder bump 122, etc.).

FIG. 6A illustrates a cross-sectional side view of an example, non-limiting device 600A that facilitates hybrid under-bump metallization components in accordance with one or more embodiments described herein. Repetitive description of like elements employed in other embodiments described herein is omitted for sake of brevity.

According to multiple embodiments, device 600A can comprise device 602 and device 200D of FIG. 2D. In some embodiments, device 602 can comprise an alternative example embodiment of device 100B of FIG. 1B, device 200B of FIG. 2B, and/or device 300A of FIG. 3A. In some embodiments, device 602 can comprise an under-bump metallization component 604, which can comprise an alternative example embodiment of under-bump metallization component 204A of device 200B described above with reference to FIG. 2B. In some embodiments, device 602 and/or under-bump metallization component 604 can comprise a stud bump 606.

According to multiple embodiments, stud bump 606 can comprise a conductive material. For example, stud bump 606 can comprise gold (Au) and/or another conductive material. In some embodiments, stud bump 606 can be formed on solder wetting layer 112 by employing, for example, a modified wire bonding process or a stud bumping process (also referred to as stud bump bonding) using a wire bonder.

In some embodiments, under-bump metallization component 604 can be coupled (e.g., electrically, mechanically, operatively, chemically, etc.) to under-bump metallization component 204B. For example, to facilitate such coupling of under-bump metallization component 604 to under-bump metallization component 204B, device 602 can be coupled (e.g., electrically, mechanically, operatively, chemically, etc.) to device 200D to form device 600B (e.g., as described below with reference to FIG. 6B).

FIG. 6B illustrates a cross-sectional side view of an example, non-limiting device 600B that facilitates hybrid under-bump metallization components in accordance with one or more embodiments described herein. Repetitive description of like elements employed in other embodiments described herein is omitted for sake of brevity.

According to multiple embodiments, device 600B can be formed by coupling (e.g., electrically, mechanically, operatively, chemically, etc.) device 602 to device 200D. For example, device 602 can be coupled (e.g., electrically, mechanically, operatively, chemically, etc.) to device 200D by employing a cold welding technique (also referred to as contact welding). In this example, based on implementing such cold welding technique, under-bump metallization component 604 of device 602 can be inserted into and coupled to solder bump 122, thereby facilitating formation of device 600B and coupling (e.g., electrically, mechanically, operatively, chemically, etc.) under-bump metallization component 604 to under-bump metallization component 204A. It should be appreciated that stud bump 606 can serve as a stand-off during cold welding of device 602 to device 200D and can further facilitate improved mechanical coupling of device 602 to device 200D.

In some embodiments, device 600B can comprise a flip chip device. For example, device 600B can comprise a flip chip device comprising one or more hermetically sealed superconducting interconnect components (e.g., second superconducting layers 106, third superconducting layers 108, solder bump 122, etc.) and/or one or more mechanical interconnect components (e.g., solder diffusion layers 110, solder wetting layers 112, intermetallic compound layers 120, solder bump 122, stud bump 606, etc.).

Figures 7A, 7B:
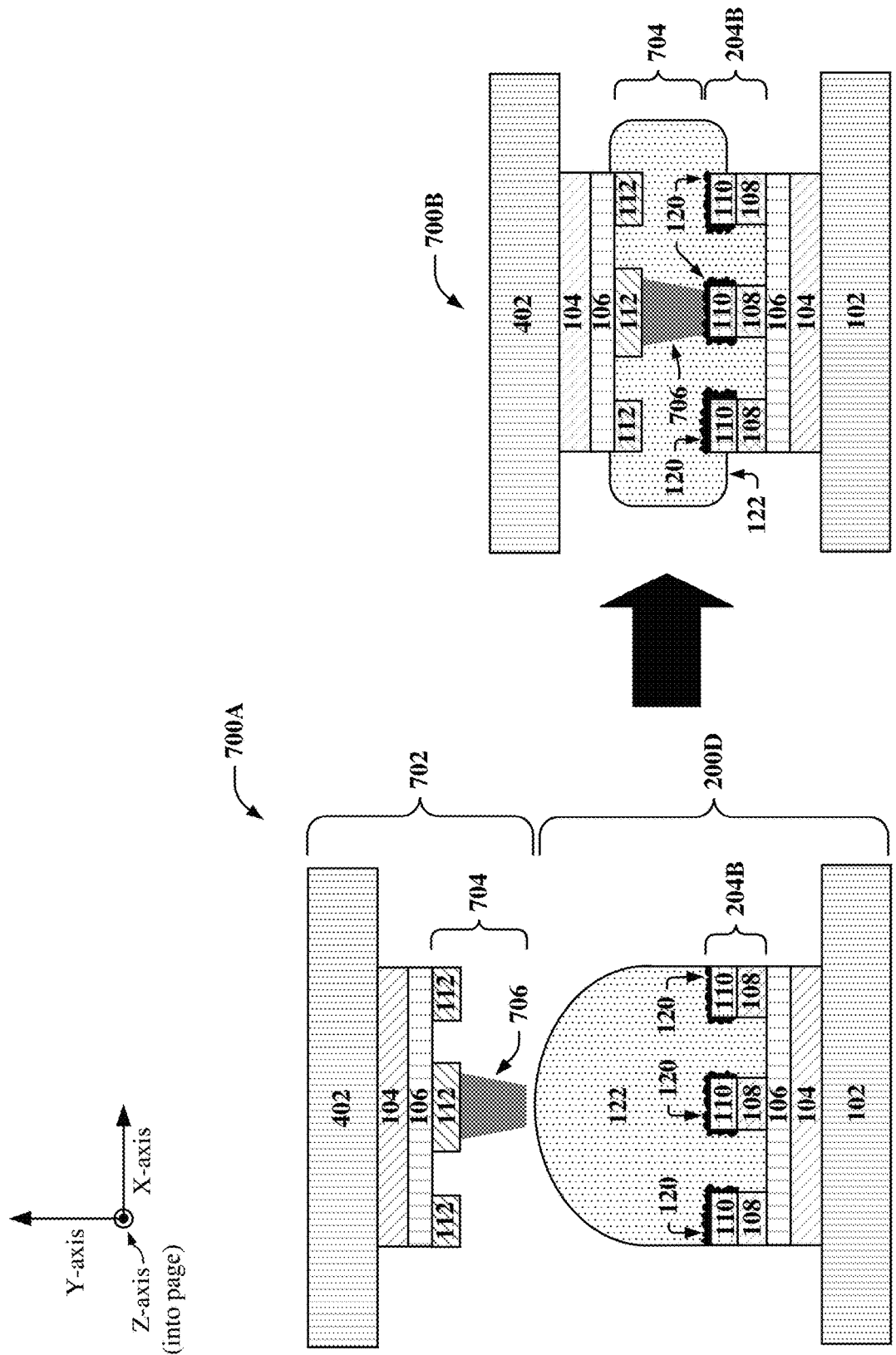
FIG. 7A illustrates a cross-sectional side view of an example, non-limiting device that facilitates hybrid under-bump metallization components in accordance with one or more embodiments described herein.
FIG. 7B illustrates a cross-sectional side view of an example, non-limiting device that facilitates hybrid under-bump metallization components in accordance with one or more embodiments described herein.

FIG. 7A illustrates a cross-sectional side view of an example, non-limiting device 700A that facilitates hybrid under-bump metallization components in accordance with one or more embodiments described herein. Repetitive description of like elements employed in other embodiments described herein is omitted for sake of brevity.

According to multiple embodiments, device 700A can comprise device 702 and device 200D of FIG. 2D. In some embodiments, device 702 can comprise an alternative example embodiment of device 100B of FIG. 1B, device 200B of FIG. 2B, and/or device 300A of FIG. 3A. In some embodiments, device 702 can comprise an under-bump metallization component 704, which can comprise an alternative example embodiment of under-bump metallization component 204A of device 200B described above with reference to FIG. 2B. In some embodiments, device 702 and/or under-bump metallization component 704 can comprise a plated pedestal 706.

According to multiple embodiments, plated pedestal 706 can comprise a conductive material. For example, plated pedestal 706 can comprise copper (Cu) and/or another conductive material. In some embodiments, plated pedestal 706 can be formed on solder wetting layer 112 by employing, for example, an electroplating process.

In some embodiments, under-bump metallization component 704 can be coupled (e.g., electrically, mechanically, operatively, chemically, etc.) to under-bump metallization component 204B. For example, to facilitate such coupling of under-bump metallization component 704 to under-bump metallization component 204B, device 702 can be coupled (e.g., electrically, mechanically, operatively, chemically, etc.) to device 200D to form device 700B (e.g., as described below with reference to FIG. 7B).

FIG. 7B illustrates a cross-sectional side view of an example, non-limiting device 700B that facilitates hybrid under-bump metallization components in accordance with one or more embodiments described herein. Repetitive description of like elements employed in other embodiments described herein is omitted for sake of brevity.

According to multiple embodiments, device 700B can be formed by coupling (e.g., electrically, mechanically, operatively, chemically, etc.) device 702 to device 200D. For example, device 702 can be coupled (e.g., electrically, mechanically, operatively, chemically, etc.) to device 200D by employing a cold welding technique (also referred to as contact welding). In this example, based on implementing such cold welding technique, under-bump metallization component 704 of device 702 can be inserted into and coupled to solder bump 122, thereby facilitating formation of device 700B and coupling (e.g., electrically, mechanically, operatively, chemically, etc.) under-bump metallization component 704 to under-bump metallization component 204A. It should be appreciated that plated pedestal 706 can serve as a stand-off during cold welding of device 702 to device 200D and can further facilitate improved mechanical coupling of device 702 to device 200D.

In some embodiments, device 700B can comprise a flip chip device. For example, device 700B can comprise a flip chip device comprising one or more hermetically sealed superconducting interconnect components (e.g., second superconducting layers 106, third superconducting layers 108, solder bump 122, etc.) and/or one or more mechanical interconnect components (e.g., solder diffusion layers 110, solder wetting layers 112, intermetallic compound layers 120, solder bump 122, plated pedestal 706, etc.).

Figure 8:
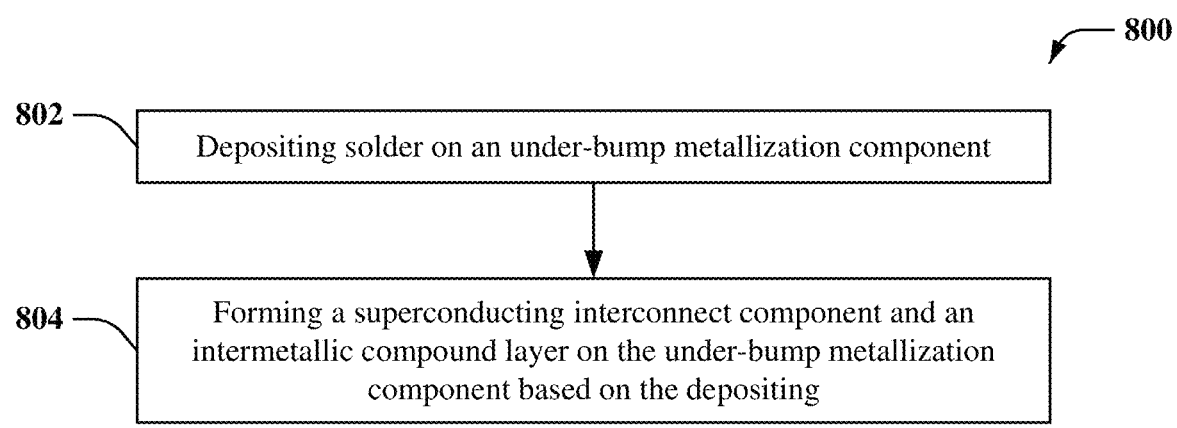
FIG. 8 illustrates a flow diagram of an example, non-limiting method that facilitates implementing hybrid under-bump metallization components in accordance with one or more embodiments described herein.

FIG. 8 illustrates a flow diagram of an example, non-limiting method 800 that facilitates implementing hybrid under-bump metallization components in accordance with one or more embodiments described herein. Repetitive description of like elements employed in other embodiments described herein is omitted for sake of brevity.

In some embodiments, method 800 can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the operations described herein, including the non-limiting operations of method 800 illustrated in FIG. 8. As a non-limiting example, the one or more processors can facilitate performance of the operations described herein, for example, method 800, by directing or controlling one or more systems and/or equipment operable to perform semiconductor fabrication.

At 802, depositing (e.g., via computer 1012) solder (e.g., injection molten solder (IMS) and/or solder bump 122) on an under-bump metallization component (e.g., under-bump metallization component 124A, under-bump metallization component 124B, under-bump metallization component 204A, and/or under-bump metallization component 204B).

At 804, forming (e.g., via computer 1012) a superconducting interconnect component (e.g., second superconducting layer 106, third superconducting layer 108, and/or solder bump 122) and an intermetallic compound layer (e.g., intermetallic compound layer 120) on the under-bump metallization component based on the depositing.

In some embodiments, such depositing of operation 802 and forming of operation 804 can be performed (e.g., via computer 1012) by employing one or more integrated circuit fabrication techniques described above with reference to FIGS. 1A-1D and/or FIGS. 2A-2D. It should be appreciated that such depositing of operation 802 and forming of operation 804 can facilitate hermetic sealing of the superconducting interconnect component (e.g., via solder bump 122), which can prevent oxide formation (e.g., oxidation) between the superconducting interconnect component (e.g., second superconducting layers 106, third superconducting layer 108, etc.) and another conductive component (e.g. solder bump 122), thereby facilitating improved electrical coupling of such components. It should also be appreciated that such depositing of operation 802 and forming of operation 804 can facilitate improved mechanical integrity of the under-bump metallization component (e.g., under-bump metallization component 124A, under-bump metallization component 124B, under-bump metallization component 204A, and/or under-bump metallization component 204B) and improved strength of the mechanical connection of the under-bump metallization component to solder bump 122. It should be further appreciated that such hermetic sealing, improved electrical coupling, improved mechanical integrity, and improved mechanical interconnection described above can be advantages of the subject disclosure over prior art.

Figure 9:
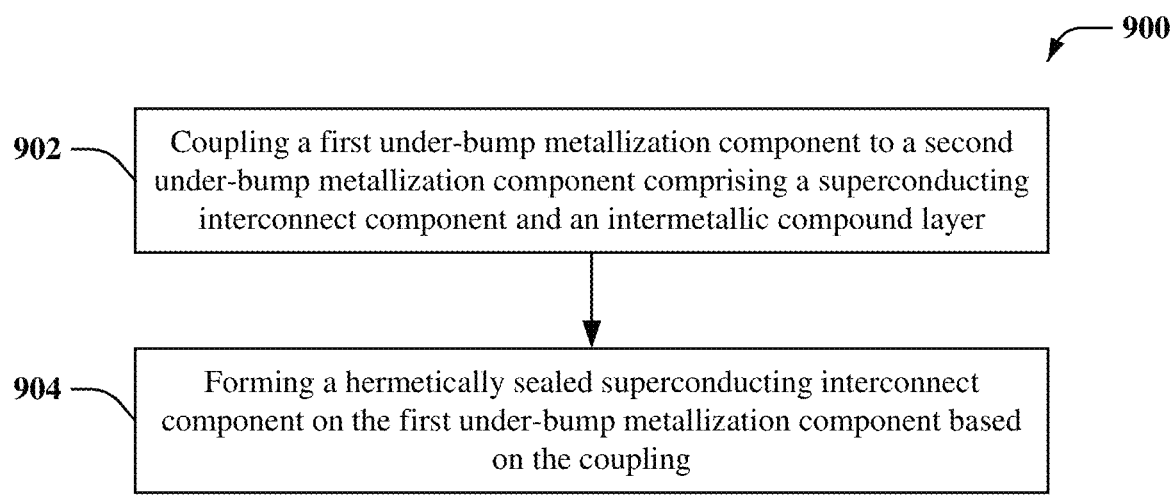
FIG. 9 illustrates a flow diagram of an example, non-limiting method that facilitates implementing hybrid under-bump metallization components in accordance with one or more embodiments described herein.

FIG. 9 illustrates a flow diagram of an example, non-limiting method 900 that facilitates implementing hybrid under-bump metallization components in accordance with one or more embodiments described herein. Repetitive description of like elements employed in other embodiments described herein is omitted for sake of brevity.

In some embodiments, method 900 can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the operations described herein, including the non-limiting operations of method 900 illustrated in FIG. 9. As a non-limiting example, the one or more processors can facilitate performance of the operations described herein, for example, method 900, by directing or controlling one or more systems and/or equipment operable to perform semiconductor fabrication.

At 902, coupling (e.g., via computer 1012) a first under-bump metallization component (e.g., under-bump metallization component 404A, under-bump metallization component 404B, under-bump metallization component 504, under-bump metallization component 508, under-bump metallization component 604, and/or under-bump metallization component 704) to a second under-bump metallization component (e.g., under-bump metallization component 124B and/or under-bump metallization component 204B) comprising a superconducting interconnect component (e.g., second superconducting layer 106, third superconducting layer 108, and/or solder bump 122) and an intermetallic compound layer (e.g., intermetallic compound layers 120).

At 904, forming (e.g., via computer 1012) a hermetically sealed superconducting interconnect component (e.g., second superconducting layer 106 and/or third superconducting layer 108 hermetically sealed by solder bump 122) on the first under-bump metallization component based on the coupling.

In some embodiments, such coupling of operation 902 and forming of operation 904 can be performed (e.g., via computer 1012) by employing one or more integrated circuit fabrication techniques (e.g., reflow soldering, cold welding, etc.) described above with reference to FIGS. 4A & 4B, FIGS. 5A-5D, FIGS. 6A & 6B, and/or FIGS. 7A & 7B. It should be appreciated that such coupling of operation 902 and forming of operation 904 can provide a flip chip device comprising one or more hermetically sealed superconducting interconnect components (e.g., second superconducting layer 106 and/or third superconducting layer 108 hermetically sealed by solder bump 122), which can prevent oxide formation (e.g., oxidation) between the hermetically sealed superconducting interconnect components (e.g., second superconducting layers 106, third superconducting layer 108, etc.) and another conductive component (e.g. solder bump 122), thereby facilitating improved electrical coupling of such components. It should also be appreciated that such coupling of operation 902 and forming of operation 904 can provide a flip chip device having improved mechanical integrity and improved strength of mechanical connections between various components of such a flip chip device (e.g., between the first under-bump metallization component and solder bump 122, between the second under-bump metallization component and solder bump 122, etc.). It should be further appreciated that such hermetic sealing, improved electrical coupling, improved mechanical integrity, and improved mechanical interconnection described above can be advantages of the subject disclosure over prior art.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that the such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 10:
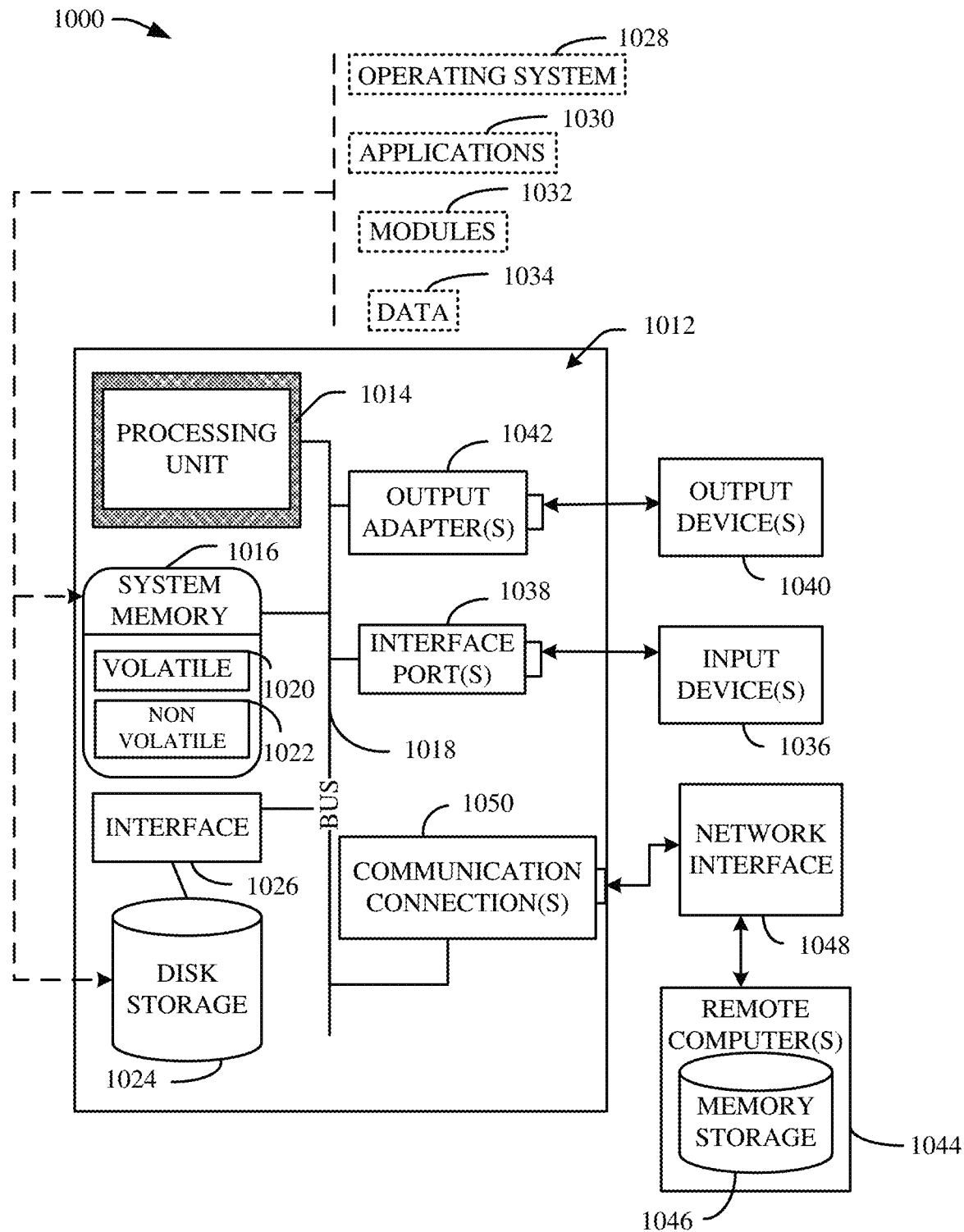
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, operating environment 1000 can be used to implement the example, non-limiting method 800 of FIG. 8 and/or non-limiting method 900 of FIG. 9, both of which facilitate implementing various embodiments of the subject disclosure described herein. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   depositing solder on an under-bump metallization component, wherein the under-bump metallization component comprises:
   one or more solder diffusion layers disposed directly on a plurality of portions of a superconducting layer;
   a hermetically sealed superconducting interconnect component; and
   one or more intermetallic compound layers disposed directly on respective ones of the one or more solder diffusion layers, wherein the one or more intermetallic compound layers are distinct from the one or more solder diffusion layers;
   forming a channel between each of the one or more solder diffusion layers and the plurality of portions of the superconducting layer under respective ones of the one or more solder diffusion layers, wherein the one or more intermetallic compound layers are between the one or more solder diffusion layers and the solder and wherein the solder is in direct contact with the plurality of portions of the superconducting layer; and
   filling the channel with the solder to hermetically seal a second superconducting layer, wherein the second superconducting layer is a single layer provided under and spanning each of the plurality of portions of the superconducting layer, wherein the solder is in direct contact with the second superconducting layer and a third superconducting layer within the channel.

2. The method of claim 1, further comprising mechanically coupling the solder to the under-bump metallization component via the one or more intermetallic compound layers.

3. The method of claim 1, the hermetically sealed superconducting interconnect is disposed to connect to a superconducting quantum circuit or a flip chip packaged quantum device.

4. The method of claim 1, further comprising electrically coupling the solder to the under-bump metallization component via the one or more intermetallic compound layers.

5. A method, comprising:
coupling a first under-bump metallization component to a second under-bump metallization component employing an intervening solder between the first under-bump metallization component and the second under-bump metallization component, wherein the first under-bump metallization component is provided on a first side of the intervening solder and the second under-bump metallization component is provided distal to the first under-bump metallization component on a second side of the intervening solder, wherein the first under-bump metallization component and the second under-bump metallization component comprise respective intermetallic compound layers, and wherein the second under-bump metallization component comprises a qubit chip coupled to a superconducting layer and having a first set of solder diffusion layers provided on a first set of respective portions of a second superconducting layer, wherein the first under-bump metallization component comprises a hermetically sealed superconducting interconnect component and a second set of solder diffusion layers provided on a second set of respective portions of a third superconducting layer, wherein the first set of solder diffusion layers, the second set of solder diffusion layers, the first set of respective portions of the second superconducting layer and the second set of respective portions of the third superconducting layer are disposed in the solder, wherein the first set of solder diffusion layers and the second set of solder diffusion layers are covered by the respective intermetallic compound layers and wherein the solder is in provided within a channel and is in direct contact with the second superconducting layer and the second third superconducting layer within the channel; and forming the hermetically sealed superconducting interconnect component on the first under-bump metallization component based on the coupling.

6. The method of claim 5, further comprising mechanically coupling the first under-bump metallization component to the second under-bump metallization component.

7. The method of claim 5, further comprising forming a stud bump on the first under-bump metallization component, wherein the forming the stud bump comprises employing a modified wire bonding process using a wire bonder for the forming the stud bump.

8. The method of claim 5, further comprising forming a plated pillar on the first under-bump metallization component.

9. The method of claim 5, wherein the coupling comprises cold welding the first under-bump metallization component to the second under-bump metallization component.

10. The method of claim 5, wherein the coupling comprises reflow soldering the first under-bump metallization component to the second under-bump metallization component.

* * * * *